United States Patent
Kayaba et al.

(10) Patent No.: US 11,965,109 B2
(45) Date of Patent: *Apr. 23, 2024

(54) SEMICONDUCTOR FILM COMPOSITION, METHOD FOR MANUFACTURING SEMICONDUCTOR FILM COMPOSITION, METHOD FOR MANUFACTURING SEMICONDUCTOR MEMBER, METHOD FOR MANUFACTURING SEMICONDUCTOR PROCESSING MATERIAL, AND SEMICONDUCTOR DEVICE

(71) Applicant: MITSUI CHEMICALS, INC., Tokyo (JP)

(72) Inventors: Yasuhisa Kayaba, Urayasu (JP); Hirofumi Tanaka, Tsukuba (JP); Koji Inoue, Ichihara (JP)

(73) Assignee: MITSUI CHEMICALS, INC., Tokyo (JP)

( * ) Notice: Subject to any disclaimer, the term of this patent is extended or adjusted under 35 U.S.C. 154(b) by 918 days.

This patent is subject to a terminal disclaimer.

(21) Appl. No.: 16/929,638

(22) Filed: Jul. 15, 2020

(65) Prior Publication Data

US 2020/0347265 A1  Nov. 5, 2020

Related U.S. Application Data

(63) Continuation of application No. 15/776,031, filed as application No. PCT/JP2016/084009 on Nov. 16, 2016, now Pat. No. 10,752,805.

(30) Foreign Application Priority Data

Nov. 16, 2015  (JP) ................. 2015-224196

(51) Int. Cl.
*C09D 177/06* (2006.01)
*C08G 69/42* (2006.01)
*C08G 73/02* (2006.01)
*C08G 73/10* (2006.01)
*H01L 21/02* (2006.01)
*H01L 21/3105* (2006.01)
*H01L 23/29* (2006.01)
*C08K 3/28* (2006.01)
*C08K 5/09* (2006.01)
*C08K 5/092* (2006.01)

(52) U.S. Cl.
CPC .......... *C09D 177/06* (2013.01); *C08G 69/42* (2013.01); *C08G 73/0293* (2013.01); *C08G 73/1003* (2013.01); *H01L 21/02118* (2013.01); *H01L 21/02142* (2013.01); *H01L 21/02203* (2013.01); *H01L 21/02282* (2013.01); *H01L 21/02318* (2013.01); *H01L 21/02343* (2013.01); *H01L 21/3105* (2013.01); *H01L 23/296* (2013.01); *C08K 3/28* (2013.01); *C08K 5/09* (2013.01); *C08K 5/092* (2013.01)

(58) Field of Classification Search
CPC ............. C08G 73/1003; C08G 69/26; C08G 73/0246; C08G 73/1007; C08G 69/42; C08G 73/0293; H01L 21/02118; H01L 21/02142; H01L 21/02203; H01L 21/02282; H01L 21/02318; H01L 21/02343; H01L 21/3105; H01L 23/296; H01L 21/02112; H01L 21/02521; H01L 21/324; C08K 3/28; C08K 5/09; C08K 5/092; C08L 77/02; C08L 79/02; C08L 101/025; C09D 177/06
USPC ..................................................... 528/10, 25
See application file for complete search history.

(56) References Cited

U.S. PATENT DOCUMENTS

| | | | |
|---|---|---|---|
| 6,329,017 B1 | 12/2001 | Liu et al. | |
| 6,447,845 B1 | 9/2002 | Nanavati et al. | |
| 9,716,026 B2 | 7/2017 | Watanabe et al. | |
| 10,752,805 B2* | 8/2020 | Kayaba | H01L 21/02343 |
| 2007/0041700 A1 | 2/2007 | Makino et al. | |
| 2011/0241210 A1 | 10/2011 | Ono et al. | |
| 2012/0076964 A1 | 3/2012 | Mitadera et al. | |
| 2013/0171826 A1 | 7/2013 | Ono et al. | |
| 2014/0378588 A1 | 12/2014 | Liang | |
| 2015/0228527 A1* | 8/2015 | Watanabe | C08L 61/32 438/459 |

FOREIGN PATENT DOCUMENTS

| | | |
|---|---|---|
| CN | 101180577 A | 5/2008 |
| CN | 102803386 A | 11/2012 |
| JP | H02-088677 A | 3/1990 |

(Continued)

OTHER PUBLICATIONS

Translation of WO 2014156616, Oct. 2, 2014. (Year: 2014).*

(Continued)

*Primary Examiner* — Douglas J McGinty
(74) *Attorney, Agent, or Firm* — BUCHANAN, INGERSOLL & ROONEY PC

(57) ABSTRACT

Provided is a composition for forming a film for semiconductor devices, including: a compound (A) including a Si—O bond and a cationic functional group containing at least one of a primary nitrogen atom or a secondary nitrogen atom; a crosslinking agent (B) which includes three or more —C(=O)OX groups (X is a hydrogen atom or an alkyl group having from 1 to 6 carbon atoms) in the molecule, in which from one to six of three or more —C(=O)OX groups are —C(=O)OH groups, and which has a weight average molecular weight of from 200 to 600; and a polar solvent (D).

14 Claims, No Drawings

(56) References Cited

FOREIGN PATENT DOCUMENTS

| JP | H08259895 A | 10/1996 | | |
|----|----|----|----|----|
| JP | 2007-197660 A | 8/2007 | | |
| JP | 2008-056897 A | 3/2008 | | |
| JP | 2008-308694 A | 12/2008 | | |
| JP | 2014-143308 A | 8/2014 | | |
| JP | 2015-004062 A | 1/2015 | | |
| KR | 10-2015-0061641 A | 6/2015 | | |
| WO | 2008/026468 A1 | 3/2008 | | |
| WO | 2010/137711 A1 | 12/2010 | | |
| WO | 2014/156616 A1 | 10/2014 | | |
| WO | WO-2014156616 A1 * | 10/2014 | ......... | C08G 73/0206 |

OTHER PUBLICATIONS

Schramm, C. et al., "Sol-gel synthesis and Characterization of Polyimides Based on the Reaction of Butane-1, 2, 3, 4-tetracarboxylic acid with 3-Aminopropyltriethoxysilane" Journal of Applied Polymer Science, Jan. 6, 2012, vol. 125, No. 2, pp. 1201-1206. (cited in Office Action dated Nov. 22, 2021, for Singaporean Application No. 10202108543V).

International Search Report (PCT/ISA/210) dated Feb. 14, 2017, by the Japanese Patent Office as the International Searching Authority for International Application No. PCT/JP2016/084009.

Written Opinion (PCT/ISA/237) dated Feb. 14, 2017, by the Japanese Patent Office as the International Searching Authority for International Application No. PCT/JP2016/084009.

Extended Search Report issued by the European Patent Office in corresponding European Patent Application No. 16866362.3 dated May 27, 2019 (12 pages).

Office Action issued by the Korean Patent Office in corresponding Korean Patent Application No. 2018-7013725 dated Apr. 18, 2019 (10 pages including partial English translation).

Notice of Reasons for Rejection issued by the Japanese Patent Office in corresponding Japanese Patent Application No. 2018-212372 dated Sep. 24, 2019 (6 pages including partial English translation).

* cited by examiner

SEMICONDUCTOR FILM COMPOSITION, METHOD FOR MANUFACTURING SEMICONDUCTOR FILM COMPOSITION, METHOD FOR MANUFACTURING SEMICONDUCTOR MEMBER, METHOD FOR MANUFACTURING SEMICONDUCTOR PROCESSING MATERIAL, AND SEMICONDUCTOR DEVICE

CROSS-REFERENCE TO RELATED APPLICATIONS

This application is a continuation of U.S. application Ser. No. 15/776,031, filed May 14, 2018, now U.S. Pat. No. 10,752,805, which is a U.S. national stage application of PCT/JP2016/084009, filed Nov. 16, 2016, which claims priority to Japanese Patent Application No. 2015-224196, filed Nov. 16, 2015, the entire contents of all of which are hereby incorporated by reference.

TECHNICAL FIELD

The present invention relates to a semiconductor film composition, a method of manufacturing a semiconductor film composition, a method of manufacturing a semiconductor member, a method of manufacturing a semiconductor processing material, and a semiconductor device.

BACKGROUND ART

Conventionally, in various technical fields such as the field of electronic devices, application of a composition containing a polymer to a member has been conducted.

For example, a method of producing a composite in which a composition containing a polymer such as polyethyleneimine or a polyethyleneimine derivative having cationic functional groups and having a weight average molecular weight of from 2,000 to 1,000,000 and having a pH of from 2.0 to 11.0 is applied to the surfaces of members A and B having predetermined conditions is known (see, for example, Patent Document 1). Patent Document 1 describes that a composite member to which a composition is applied is washed with a rinsing liquid containing a polyvalent carboxylic acid.

Patent Document 1 WO 2014/156616

SUMMARY OF INVENTION

Problems to be Solved by the Invention

In Patent Document 1, a polymer such as polyethyleneimine is applied to a member, a rinse liquid containing a polyvalent carboxylic acid is coated on the member, and then crosslinked by a heating reaction, and the number of steps is large. However, when a polymer such as a polyethyleneimine and a polyvalent carboxylic acid are mixed to prepare a composition to be applied to a member, the polymer and polyvalent carboxylic acid aggregate and the composition becomes cloudy, and when the composition is applied to a member, formation of agglomerates, pits and the like causes large unevenness, resulting in a film with insufficient smoothness, which is a problematic.

An embodiment of the invention has been made in view of the above problem, and an object of the embodiment is to provide a semiconductor film composition from which a film having few aggregates and pits, and having high smoothness can be obtained, a method of manufacturing the same, and a method of manufacturing a semiconductor member using the semiconductor film composition, and a method of manufacturing a semiconductor processing material using the semiconductor film composition, and a semiconductor device provided with a reaction product having high smoothness.

Means for Solving the Problems

Specific means for solving the above described problems are as follows.

<1> A semiconductor film composition, comprising:
a compound (A) including a Si—O bond and a cationic functional group containing at least one of a primary nitrogen atom or a secondary nitrogen atom;
a crosslinking agent (B) which includes three or more —C(=O)OX groups (X is a hydrogen atom or an alkyl group having from 1 to 6 carbon atoms) in a molecule, wherein from one to six of the three or more —C(=O)OX groups are —C(=O)OH groups, and which has a weight average molecular weight of from 200 to 600; and
a polar solvent (D).

<2> A semiconductor film composition, comprising:
a compound (A) including a Si—O bond and a cationic functional group containing at least one of a primary nitrogen atom or a secondary nitrogen atom, and having a weight average molecular weight of from 130 to 10,000;
a crosslinking agent (B) which includes three or more —C(=O)OX groups (X is a hydrogen atom or an alkyl group having from 1 to 6 carbon atoms) in a molecule, wherein from one to six of the three or more —C(=O)OX groups are —C(=O)OH groups, and which has a weight average molecular weight of from 200 to 600; and
a polar solvent (D).

<3> The semiconductor film composition according to <1> or <2>, wherein the crosslinking agent (B) has a ring structure in the molecule.

<4> The semiconductor film composition according to <3>, wherein the ring structure is at least one of a benzene ring or a naphthalene ring.

<5> The semiconductor film composition according to any one of <1> to <4>, wherein, in the crosslinking agent (B), in the three or more —C(=O)OX groups, at least one X is an alkyl group having from 1 to 6 carbon atoms.

<6> The semiconductor film composition according to any one of <1> to <5>, further comprising at least one additive (C) selected from the group consisting of an acid (C-1) having a carboxy group and having a weight average molecular weight of from 46 to 195 and a base (C-2) having a nitrogen atom and having a weight average molecular weight of from 17 to 120.

<7> The semiconductor film composition according to any one of <1> to <6>, comprising at least one selected from the group consisting of an aliphatic amine having a weight average molecular weight of from 10,000 to 400,000 and an amine compound having a ring structure in a molecule and having a weight average molecular weight of from 90 to 600.

<8> The semiconductor film composition according to any one of <1> to <7>, which is used for a filling material for a recess formed on a substrate.

<9> The semiconductor film composition according to any one of <1> to <7>, which is used in a multilayer resist method.

<10> A method of manufacturing the semiconductor film composition according to any one of <1> to <9>,
the method comprising:
a mixing step of mixing the compound (A) and the crosslinking agent (B).

<11> The method according to <10>, wherein the mixing step comprises mixing a mixture of an acid (C-1) having a carboxy group and having a weight average molecular weight of from 46 to 195 and the compound (A), and the crosslinking agent (B).

<12> The method according to <10>, wherein the mixing step comprises mixing a mixture of a base (C-2) having a nitrogen atom and having a weight average molecular weight of from 17 to 120 and the crosslinking agent (B), and the compound (A).

<13> A method of manufacturing a semiconductor member using the semiconductor film composition according to any one of <1> to <9>, the method comprising:
an application step of applying the semiconductor film composition to a substrate; and
a heating step of heating the substrate to which the semiconductor film composition has been applied, at a temperature of from 250° C. to 425° C.

<14> A method of manufacturing a semiconductor processing material using the semiconductor film composition according to any one of <1> to <7>, the method comprising:
an application step of applying the semiconductor film composition to a substrate; and
a heating step of heating the substrate to which the semiconductor film composition has been applied, at a temperature of from 250° C. to 425° C.

<15> A semiconductor device comprising:
a substrate; and
a reaction product of a compound (A) including a Si—O bond and a cationic functional group containing at least one of a primary nitrogen atom or a secondary nitrogen atom, and having a weight average molecular weight of from 130 to 10,000, and a crosslinking agent (B) which includes three or more —C(=O)OX groups (X is a hydrogen atom or an alkyl group having from 1 to 6 carbon atoms) in a molecule, wherein from one to six of the three or more —C(=O)OX groups are —C(=O)OH groups, and which has a weight average molecular weight of from 200 to 600.

<16> The semiconductor device according to <15>, wherein the reaction product includes at least one of an amide bond or an imide bond.

Effects of the Invention

According to an embodiment of the invention, a semiconductor film composition from which a film having few aggregates and pits, and having high smoothness can be obtained, a method of manufacturing the same, and a method of manufacturing a semiconductor member using the semiconductor film composition, and a method of manufacturing a semiconductor processing material using the semiconductor film composition, and a semiconductor device provided with a reaction product having high smoothness can be provided.

DESCRIPTION OF EMBODIMENT

In the present specification, a numeral value range represented by "(a value) to (a value)" means a range including the numeral values represented before and after "(a value) to (a value)" as a lower limit value and an upper limit value, respectively.

[Semiconductor Film Composition]

Hereinafter, an embodiment of a semiconductor film composition according to the invention will be described. The semiconductor film composition according to the embodiment includes a compound (A) including a Si—O bond and a cationic functional group containing at least one of a primary nitrogen atom or a secondary nitrogen atom, a crosslinking agent (B) which includes three or more —C(=O)OX groups (X is a hydrogen atom or an alkyl group having from 1 to 6 carbon atoms) in a molecule, in which from one to six of the three or more —C(=O)OX groups are —C(=O)OH groups, and which has a weight average molecular weight of from 200 to 600, and a polar solvent (D).

A semiconductor film composition according to the embodiment is used. Specifically, by coating the semiconductor film composition on a member to form a film, a film having few aggregates and pits and high smoothness can be obtained. By using the semiconductor film composition according to the embodiment, a film having high smoothness as compared with the technique of Patent Document 1 (WO 2014/156616) can be easily obtained.

By using the semiconductor film composition according to the embodiment, a film having small unevenness and favorable smoothness can be formed. For example, when a film is formed using the semiconductor film composition according to the embodiment on a smooth substrate such as a silicon substrate, a film in which the difference between the maximum value and the minimum value of the film thickness is 25% or less of the average film thickness with a field of view of 500 nm width at 200,000 magnification of a scanning electron microscope (SEM) can be formed.

In addition, in the technique of Patent Document 1 described above, since a polymer such as polyethyleneimine is applied to a member, a rinse liquid containing a polyvalent carboxylic acid is applied on the member, and then the polymer is crosslinked by heating reaction, the applied polymer may dissolve in a rinsing liquid containing a polyvalent carboxylic acid. Therefore, with respect to a film formed on a member, the thickness of a film on the surface of a large-diameter wafer is unlikely to be uniform, and it is not easy to control the film thickness.

In the technique of Patent Document 1 described above, when a thick film of several tens of nanometers or more is formed, since a polyvalent carboxylic acid hardly permeates to the interface between a member and a polymer, the composition the film in the thickness direction is unlikely to be uniform.

On the other hand, in the embodiment, by applying a semiconductor film composition containing a compound (A) and a crosslinking agent (B) to a member to form a film, smoothness can be enhanced and composition uniformity in the film thickness direction can be enhanced.

By using the semiconductor film composition according to the embodiment, a film having excellent smoothness and composition uniformity in the film thickness direction, and having, for example, a thickness of from 0.5 nm to 5 μm can be formed. A film having excellent smoothness can be formed on the surface of a large diameter silicon substrate. For example, when the film thickness is set to from 5 nm to 150 nm, the film thickness variation between the center and an edge portion of a 300 mmφ silicon substrate can be ±15% or less, and preferably ±10% or less.

The semiconductor film composition according to the embodiment is a composition for forming a film for semiconductor devices (hereinafter also referred to as "composition" in some cases). Such a composition is used for forming: a gap fill material (buried planarization film) filled in a recess formed in a substrate; an insulating material (buried insulating film) filled in a recess formed in a substrate; a barrier material (barrier film) provided between a low dielectric constant material such as a porous material and a metal and having insulating properties, adhesiveness, pore sealing property, and the like; an insulating material (through-silicon via insulating film) which is provided between a metal and a silicon substrate or between a metal and an insulating film on a via sidewall of a through-silicon via substrate and has adhesiveness and insulating properties; or the like.

In particular, a filling material (buried planarization film) for a recess formed in a substrate may be used for complex processing of the substrate.

One method of transferring a lithography pattern onto a substrate using a hard mask is a multilayer resist method. The multilayer resist method uses a photoresist film or an upper layer resist film and an underlying film having different etching selectivity or a lower layer resist film. The multilayer resist method is a method in which, for example, a lower layer resist film containing silicon is interposed between an upper layer resist film and a substrate to be processed, a pattern is provided on the upper layer resist film, and then, using the upper layer resist pattern as an etching mask, the pattern is transferred onto the lower layer resist film, and further, the pattern is transferred onto the substrate to be processed using the lower layer resist pattern as an etching mask.

Examples of the composition of the lower layer resist film used in such a multilayer resist method include a silicon-containing inorganic film, a $SiO_2$ film, a SiON film, and the like by CVD.

However, as miniaturization of semiconductor devices further progresses, not only the line width of a pattern becomes finer but also the film thickness of an upper layer resist film becomes thin in order to prevent a pattern collapse, and as for performances demanded for a lower layer resist film, improvement of the embedding property and the etching selectivity in a finer pattern than before has been demanded.

In manufacturing processes of semiconductor devices in a limit region of recent lithography, a complicated process such as double patterning as described above has been proposed. Devices such as integrated circuit elements are also becoming more complicated, and a method of forming a multilayer resist pattern on a patterned substrate such as a wiring trench (trench) and a plug trench (via), a method of forming a complicated pattern or the like by performing a pattern formation a plurality of times, or the like is also employed.

On the other hand, in a multilayer resist method, for example, dry etching such as plasma etching is widely used when transferring an upper layer resist pattern onto a lower layer resist film or transferring a lower layer resist pattern onto a substrate to be processed.

Most of the resist films practically used in a conventional multilayer resist method have been organic films, silicon-containing inorganic films by CVD as described above, or the like. However, in a conventional CVD method, it is becoming difficult to embed microscopic grooves without voids owing to problems such as overhanging.

A resist film may be demanded to have heat resistance (for example, resistance to heat treatment which may be applied after forming a resist film) in some cases.

From the viewpoint of realizing fine pattern formation, the above requirements for embedding property, etching selectivity, and heat resistance are also demanded for a film (for example, a buried insulating film (shallow trench isolating film (STI film), a pre-metal insulating film (PMD film), an inter-wiring layer insulating film (IMD film), or the like) other than a resist film.

Since the composition according to the embodiment is excellent in embedding property, etching selectivity, and heat resistance, the composition can be used for manufacturing a resist film used in a multilayer resist method or the above-described film other than the resist film.

As another method of forming a fine pattern, the composition according to the embodiment may be used for forming an inverted resist formed by coating on a photoresist after exposure and replacing the composition with a photoresist of a photosensitive or non-photosensitive portion. By forming the inverted resist, a film with excellent etching resistance and less pattern collapse can be formed.

(Compound (A))

The composition according to the embodiment includes a Si—O bond and a compound (A) including a cationic functional group containing at least one of a primary nitrogen atom or a secondary nitrogen atom. The compound (A) may be a compound including a Si—O bond and a cationic functional group containing at least one of a primary nitrogen atom or a secondary nitrogen atom and having a weight average molecular weight of from 130 to 10,000.

The compound (A) is a compound including a cationic functional group containing at least one of a primary nitrogen atom or a secondary nitrogen atom. The cationic functional group is not particularly limited as long as the group is a functional group which can be positively charged and contains at least one of a primary nitrogen atom or a secondary nitrogen atom.

In addition to the primary nitrogen atom and the secondary nitrogen atom, the compound (A) may contain a tertiary nitrogen atom.

Herein, a "primary nitrogen atom" refers to a nitrogen atom (for example, a nitrogen atom contained in a primary amino group (—$NH_2$ group)) bonded only to two hydrogen atoms and one atom other than a hydrogen atom, or a nitrogen atom (cation) bonded to only three hydrogen atoms and one atom other than a hydrogen atom.

A "secondary nitrogen atom" refers to a nitrogen atom (in other words, a nitrogen atom contained in a functional group represented by the following Formula (a)) bonded only to one hydrogen atom and two atoms other than a hydrogen atom, or a nitrogen atom (cation) bonded only to two hydrogen atoms and two atoms other than a hydrogen atom.

A "tertiary nitrogen atom" refers to a nitrogen atom bonded only to three atoms other than a hydrogen atom (in other words, a nitrogen atom which is a functional group represented by the following Formula (b)) or a nitrogen atom (cation) bonded only to one hydrogen atom and three atoms other than a hydrogen atom.

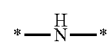

(a)

In Formulae (a) and (b), * represents a bonding position with an atom other than a hydrogen atom.

Here, the functional group represented by Formula (a) may be a functional group constituting a part of a secondary amino group (—NHR$^a$ group; wherein R$^a$ represents an alkyl group), or may be a divalent linking group contained in the skeleton of the polymer.

The functional group represented by Formula (b) (in other words, a tertiary nitrogen atom) may be a functional group constituting a part of a tertiary amino group (—NR$^b$R$^c$ group; wherein each of R$^b$ and R$^c$ independently represents an alkyl group) or may be a trivalent linking group contained in the skeleton of the polymer.

The weight average molecular weight of the compound (A) is preferably from 130 to 10,000, more preferably from 130 to 5,000, and still more preferably from 130 to 2,000.

Herein, a weight average molecular weight refers to a weight average molecular weight in terms of polyethylene glycol measured by a gel permeation chromatography (GPC) method.

Specifically, the weight average molecular weight is calculated by an analysis software (EMPOWER 3 manufactured by Waters Corporation) using an aqueous solution having a sodium nitrate concentration of 0.1 mol/L as a developing solvent, using an analyzer SHODEX DET RI-101 and two analytical columns (TSKgel G6000PWXL-CP and TSKgel G3000PWXL-CP manufactured by Tosoh Corporation) at a flow rate of 1.0 mL/min, and using polyethylene glycol/polyethylene oxide as a standard product.

The compound (A) may further contain an anionic functional group, a nonionic functional group, or the like, if necessary.

The nonionic functional group may be a hydrogen bond receptor or a hydrogen bond donor. Examples of the nonionic functional group include a hydroxy group, a carbonyl group, and an ether group (—O—).

The anionic functional group is not particularly limited as long as the group is a functional group capable of being negatively charged. Examples of the anionic functional group include a carboxylic acid group, a sulfonic acid group, and a sulfuric acid group.

Examples of the compound having a Si—O bond and an amino group include siloxane diamine, a silane coupling agent having an amino group, and a siloxane polymer.

Examples of the silane coupling agent having an amino group include a compound represented by the following Formula (A-3).

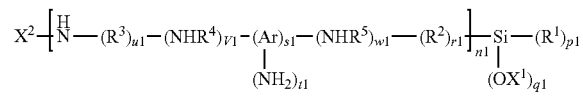

(A-3)

p1 = 0-2, q1 = 1-3, n1 = 1-3, r1 = 0-1, s1 = 0-1, t1 = 0-1, u1 = 0-1, v1 = 0-1, w1 = 0-1, p1 + q1 = 3

In Formula (A-3), R$^1$ represents an optionally substituted alkyl group having from 1 to 4 carbon atoms. Each of R$^2$ and R$^3$ independently represents an optionally substituted alkylene group having from 1 to 12 carbon atoms (optionally containing a carbonyl group, an ether group, or the like in the skeleton), an ether group, or a carbonyl group. Each of R$^4$ and R$^5$ independently represents an optionally substituted alkylene group having from 1 to 4 carbon atoms or a single bond. Ar represents a divalent or trivalent aromatic ring. X$^1$ represents hydrogen or an optionally substituted alkyl group having from 1 to 5 carbon atoms. X$^2$ represents hydrogen, a cycloalkyl group, a heterocyclic group, an aryl group, or an optionally substituted alkyl group having from 1 to 5 carbon atoms (optionally containing a carbonyl group, an ether group, or the like in the skeleton)). A plurality of R$^1$, R$^2$, R$^3$, R$^4$, R$^5$, and X$^1$ may be the same or different.

Examples of the substituent of an alkyl group and an alkylene group in R$^1$, R$^2$, R$^3$, R$^4$, R$^5$, X$^1$, and X$^2$ each independently includes an amino group, a hydroxy group, an alkoxy group, a cyano group, a carboxylic acid group, a sulfonic acid group, and a halogen.

Examples of the divalent or trivalent aromatic ring in Ar include a divalent and trivalent benzene ring. Examples of the aryl group in X$^2$ include a phenyl group, a methylbenzyl group, and a vinylbenzyl group.

Specific examples of the silane coupling agent represented by Formula (A-3) include N-(2-aminoethyl)-3-aminopropylmethyldiethoxysilane, N-(2-aminoethyl)-3-aminopropyltriethoxysilane, N-(2-aminoethyl)-3-aminoisobutyldimethylmethoxysilane, N-(2-aminoethyl)-3-aminoisobutylmethyldimethoxysilane, N-(2-aminoethyl)-11-aminoundecyltrimethoxysilane, 3-aminopropyltrimethoxysilane, 3-aminopropyltriethoxysilane, N-phenyl-3-aminopropyltrimethoxysilane, (aminoethylaminoethyl)phenyltriethoxysilane, methylbenzylaminoethylaminopropyltrimethoxysilane, benzylaminoethylaminopropyltriethoxysilane, 3-ureidopropyltriethoxysilane, (aminoethylaminoethyl)phenethyltrimethoxysilane, (aminoethylaminomethyl)phenethyltrimethoxysilane, N-[2-[3-(trimethoxysilyl)propylamino]ethyl]ethylenediamine, 3-aminopropyldiethoxymethylsilane, 3-aminopropyldimethoxymethylsilane, 3-aminopropyldimethylethoxysilane, 3-aminopropyldimethylmethoxysilane, trimethoxy[2-(2-aminoethyl)-3-aminopropyl]silane, diaminomethylmethyldiethoxysilane, methylaminomethylmethyldiethoxysilane, p-aminophenyltrimethoxysilane, N-methylaminopropyltriethoxysilane, N-methylaminopropylmethyldiethoxysilane, (phenylaminomethyl)methyldiethoxysilane, acetamidopropyltrimethoxysilane, and hydrolysates thereof.

Examples of the silane coupling agent containing an amino group other than Formula (A-3) include N,N-bis[3-(trimethoxysilyl)propyl]ethylenediamine, N,N'-bis[3-(trimethoxysilyl) propyl]ethylenediamine, bis[(3-triethoxysilyl)propyl] amine, piperazinylpropylmethyldimethoxysilane, bis[3-(triethoxysilyl)propyl]urea, bis(methyldiethoxysilylpropyl)amine, 2,2-dimethoxy-1,6-diaza-2-silacyclooctane, 3,5-diamino-N-(4-(methoxydimethylsilyl)phenyl)benzamide, 3,5-diamino-N-(4-(triethoxysilyl)phenyl)benzamide, 5-(ethoxydimethylsilyl)benzene-1,3-diamine, and hydrolysates thereof.

The silane coupling agent having an amino group may be used singly or in combination of two or more kinds thereof. A combination of a silane coupling agent having an amino group and a silane coupling agent having no amino group may also be used. For example, a silane coupling agent having a mercapto group may be used for improving adhesiveness with a metal.

Among these silane coupling agents, a polymer (siloxane polymer) formed through a siloxane bond (Si—O—Si) may be used. For example, from a hydrolyzate of 3-aminopropyltrimethoxysilane, a polymer having a linear siloxane structure, a polymer having a branched siloxane structure, a polymer having a cyclic siloxane structure, a polymer having a cage-like siloxane structure, or the like can be obtained. The cage-like siloxane structure is represented, for example, by the following Formula (A-1).

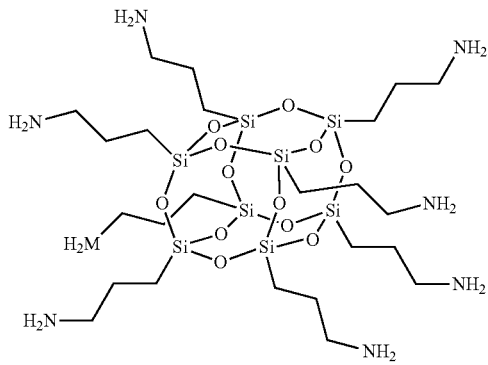

(A-1)

Examples of the siloxane diamine include a compound represented by the following Formula (A-2). In Formula (A-2), i is an integer from 0 to 4, j is an integer from 1 to 3, and Me is a methyl group.

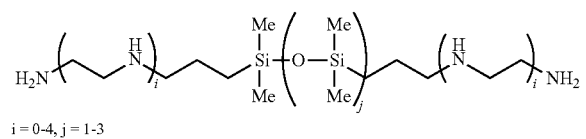

(A-2)

Examples of the siloxane diamine include 1,3-bis(3-aminopropyl)tetramethyldisiloxane (i=0, j=1 in Formula (A-2) and 1,3-bis(2-aminoethylamino)propyltetramethyldisiloxane (i=1, j=1 in Formula (A-2).

Since the compound (A) has an amino group, the compound is easily dissolved in a polar solvent (D) described below. The ratio (the total number of primary nitrogen atoms and secondary nitrogen atoms/the number of silicon atoms) of the total number of primary nitrogen atoms and secondary nitrogen atoms and the number of silicon atoms in the compound (A) is preferably from 0.2 to 5 from the viewpoint of solubility.

By using the compound (A) which is easily dissolved in the polar solvent (D), affinity with a hydrophilic surface such as a silicon substrate is increased, and as a result, a smooth film can be formed.

From the viewpoint of plasma resistance, it is more preferable that the compound (A) satisfies the relationship of (non-crosslinkable group)/Si<2 in terms of molar ratio of non-crosslinkable groups such as methyl groups bonded to Si. By satisfying this relationship, it is presumed that crosslinking (crosslinking between a Si—O—Si bond and an amide bond, an imide bond, or the like) density of a film to be formed is improved, and a film having higher rigidity to plasma is formed.

As described above, the compound (A) has a cationic functional group containing at least one of a primary nitrogen atom or a secondary nitrogen atom. Here, in a case in which the compound (A) contains a primary nitrogen atom, the proportion of the primary nitrogen atoms in all the nitrogen atoms in the compound (A) is preferably 20% by mole or more, more preferably 25% by mole or more, and still more preferably 30% by mole or more. The compound (A) may have a cationic functional group containing a primary nitrogen atom and containing no nitrogen atoms (for example, a secondary nitrogen atom or a tertiary nitrogen atom) other than the primary nitrogen atom.

In a case in which the compound (A) contains a secondary nitrogen atom, the proportion of the secondary nitrogen atoms in all the nitrogen atoms in the compound (A) is preferably from 5% by mole to 50% by mole, and more preferably from 10% by mole to 45% by mole.

In addition to the primary nitrogen atom and the secondary nitrogen atom, the compound (A) may contain a tertiary nitrogen atom. In a case in which the compound (A) contains a tertiary nitrogen atom, the proportion of the tertiary nitrogen atom in all the nitrogen atoms in the compound (A) is preferably from 20% by mole to 50% by mole, and more preferably from 25% by mole to 45% by mole.

In the present embodiment, the content of the compound (A) in a composition is not particularly limited, and for example, may be from 0.001% by mass to 20% by mass with respect to the total composition. The content is preferably from 0.01% by mass to 20% by mass, and more preferably from 0.04% by mass to 20% by mass.

(Crosslinking Agent (B))

The composition according to the embodiment includes a crosslinking agent (B) which includes three or more —C(=O)OX groups (X is a hydrogen atom or an alkyl group having from 1 to 6 carbon atoms) in the molecule, in which from one to six of three or more —C(=O)OX groups (hereinafter also referred to as "COOX") are —C(=O)OH groups (hereinafter also referred to as "COOH"), and which has a weight average molecular weight of from 200 to 600.

The crosslinking agent (B) is a compound having three or more —C(=O)OX groups in the molecule (X is a hydrogen atom or an alkyl group having from 1 to 6 carbon atoms), and preferably is a compound having from three to six —C(=O)OX groups in the molecule, and more preferably, is a compound having from three or four —C(=O)OX groups in the molecule.

In the crosslinking agent (B), examples of X in the —C(=O)OX group include a hydrogen atom or an alkyl group having from 1 to 6 carbon atoms, and among them, a hydrogen atom, a methyl group, an ethyl group, and a propyl group are preferable. Xs in the —C(=O)OX groups may be the same or different from each other.

The crosslinking agent (B) is a compound having from 1 to 6 —C(=O)OH groups in the molecule wherein X is a hydrogen atom, and is preferably a compound having from 1 to 4 —C(=O)OH groups in the molecule, is more preferably a compound having from 2 to 4 —C(=O)OH groups in the molecule, and is still more preferably a compound having from two or three —C(=O)OH groups in the molecule.

The crosslinking agent (B) is a compound having a weight average molecular weight of from 200 to 600. Preferably, the crosslinking agent is a compound having from 200 to 400.

The crosslinking agent (B) preferably has a ring structure in the molecule. Examples of the ring structure include an alicyclic structure and an aromatic ring structure. The crosslinking agent (B) may have a plurality of ring structures in the molecule, and the plurality of ring structures may be the same or different from each other.

Examples of the alicyclic structure include an alicyclic structure having from 3 to 8 carbon atoms, and preferably an alicyclic structure having from 4 to 6 carbon atoms, and the inside of the ring structure may be saturated or unsaturated. More specific examples of the alicyclic structure include a saturated alicyclic structure such as a cyclopropane ring, a cyclobutane ring, a cyclopentane ring, a cyclohexane ring, a cycloheptane ring, or a cyclooctane ring; and an unsaturated alicyclic structure such as a cyclopropene ring, a cyclobutene ring, a cyclopentene ring, a cyclohexene ring, a cycloheptene ring, or a cyclooctene ring.

The aromatic ring structure is not particularly limited as long as the structure is a ring structure exhibiting aromaticity, and examples thereof include: a benzene aromatic ring such as a benzene ring, a naphthalene ring, an anthracene ring, or a perylene ring; an aromatic heterocyclic ring such as a pyridine ring or a thiophene ring; and a nonbenzene aromatic ring such as an indene ring or an azulene ring.

The cyclic structure of the crosslinking agent (B) in the molecule is preferably, for example, at least one selected from the group consisting of a cyclobutane ring, a cyclopentane ring, a cyclohexane ring, a benzene ring and a naphthalene ring, and from the viewpoint of further improving the heat resistance of a film obtained from a composition, at least one of a benzene ring or a naphthalene ring is more preferable.

As described above, the crosslinking agent (B) may have a plurality of ring structures in the molecule, and may have a biphenyl structure, a benzophenone structure, a diphenyl ether structure, or the like in a case in which the ring structure is benzene.

The crosslinking agent (B) preferably has a fluorine atom in the molecule, more preferably has from 1 to 6 fluorine atoms in the molecule, and still more preferable has from 3 to 6 fluorine atoms in the molecule. For example, the crosslinking agent (B) may have a fluoroalkyl group in the molecule, and specifically may have a trifluoroalkyl group or a hexafluoroisopropyl group.

Further examples of the crosslinking agent (B) include a carboxylic acid compound such as an alicyclic carboxylic acid, a benzene carboxylic acid, a naphthalene carboxylic acid, a diphthalic acid, or a fluorinated aromatic ring carboxylic acid; and a carboxylic acid ester compound such as an alicyclic carboxylic acid ester, a benzene carboxylic acid ester, a naphthalene carboxylic acid ester, a diphthalic acid ester, or a fluorinated aromatic ring carboxylic acid ester. The carboxylic acid ester compound is a compound which includes carboxy groups (—C(=O)OH group) in the molecule and in which, in three or more —C(=O)OX groups, at least one X is an alkyl group having from 1 to 6 carbon atoms (in other words, an ester bond is contained). In the composition according to the embodiment, since the crosslinking agent (B) is a carboxylic acid ester compound, aggregation due to association of the compound (A) and the crosslinking agent (B) in the composition is suppressed, agglomerates and pits are reduced, and a film having a higher smoothness or a film having a large film thickness can be obtained, and the film thickness can be easily adjusted.

The carboxylic acid compound is preferably a tetravalent or less carboxylic acid compound containing four or less —C(=O)OH groups, and more preferably a trivalent or tetravalent carboxylic acid compound containing three or four —C(=O)OH groups.

The carboxylic acid ester compound is preferably a compound containing three or less carboxy groups (—C(=O) OH groups) in the molecule and three or less ester bonds, and more preferably a compound containing two or less carboxy groups in the molecule and two or less ester bonds.

In the carboxylic acid ester compound, when, in three or more —C(=O)OX groups, X is an alkyl group having from 1 to 6 carbon atoms, X is preferably a methyl group, an ethyl group, a propyl group, a butyl group or the like, and from the viewpoint of further suppressing aggregation by association between the compound (A) and the crosslinking agent (B) in the composition, X is preferably an ethyl group or a propyl group.

Specific examples of the carboxylic acid compound include, but are not limited to, an alicyclic carboxylic acid such as 1,2,3,4-cyclobutane tetracarboxylic acid, 1,2,3,4-cyclopentane tetracarboxylic acid, 1,3,5-cyclohexane tricarboxylic acid, 1,2,4-cyclohexane tricarboxylic acid, 1,2,4,5-cyclohexanetetracarboxylic acid, or 1,2,3,4,5,6-cyclohexanehexacarboxylic acid; a benzene carboxylic acid such as 1,2,4-benzene tricarboxylic acid, 1,3,5-benzene tricarboxylic acid, pyromellitic acid, benzene pentacarboxylic acid, or mellitic acid; a naphthalene carboxylic acid such as 1,4,5,8-naphthalenetetracarboxylic acid or 2,3,6,7-naphthalenetetracarboxylic acid; a diphthalic acid such as 3,3',5,5'-tetracarboxydiphenylmethane, biphenyl-3,3',5,5'-tetracarboxylic acid, biphenyl-3,4',5-tricarboxylic acid, biphenyl-3,3',4,4'-tetracarboxylic acid, benzophenone-3,3',4,4'-tetracarboxylic acid, 4,4'-oxydiphthalic acid, 3,4'-oxydiphthalic acid, 1,3-bis(phthalic acid) tetramethyldisiloxane, 4,4'-(ethyne-1,2-diyl)diphthalic acid, 4,4'-(1,4-phenylenebis(oxy)) diphthalic acid, 4,4'-([1,1'-biphenyl]-4,4'-diylbis(oxy))diphthalic acid, or 4,4'-((oxybis(4,1-phenylene))bis(oxy))diphthalic acid; a perylene carboxylic acid such as perylene-3,4,9,10-tetracarboxylic acid; an anthracene carboxylic acid such as anthracene-2,3,6,7-tetracarboxylic acid; and a fluorinated aromatic carboxylic acid such as 4,4'-(hexafluoroisopropylidene)diphthalic acid, 9,9-bis(trifluoromethyl)-9H-xanthene-2,3,6,7-tetracarboxylic acid, or 1,4-ditrifluoromethyl pyromellitic acid.

Specific examples of the carboxylic acid ester compound include a compound in which at least one carboxy group in a specific example of the carboxylic acid compound is substituted with an ester group. Examples of the carboxylic acid ester compound include half esterified compounds represented by the following Formulae (B-1) to (B-6).

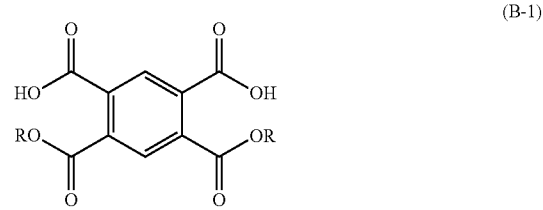

(B-1)

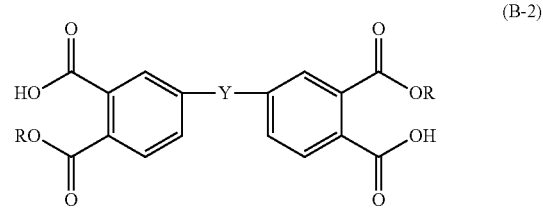

(B-2)

Y = O, C=O, C(CF$_3$)$_2$

-continued

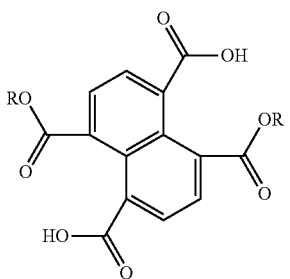

(B-3)

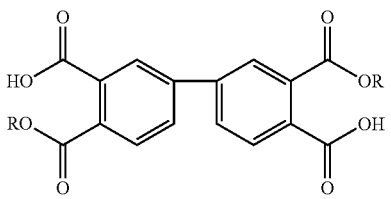

(B-4)

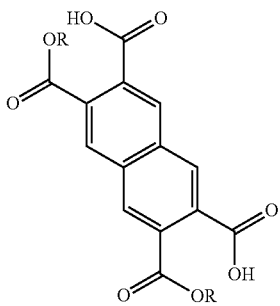

(B-5)

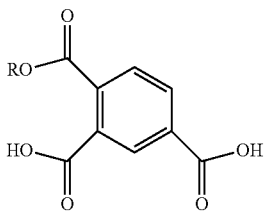

(B-6)

R in Formulae (B-1) to (B-6) is an alkyl group having from 1 to 6 carbon atoms, and among these, a methyl group, an ethyl group, a propyl group, or a butyl group is preferable, and an ethyl group or a propyl group is more preferable.

The half esterified compound can be produced, for example, by mixing a carboxylic anhydride which is an anhydride of the aforementioned carboxylic acid compound in an alcohol solvent, and opening a carboxylic acid anhydride.

In the present embodiment, the content of the crosslinking agent (B) in the composition is not particularly limited, and for example, the ratio (COOH/N) of the number of carboxy groups in the crosslinking agent (B) to the total number of nitrogen atoms in the compound (A) is preferably from 0.1 to 3.0, more preferably from 0.3 to 2.5, and still more preferably from 0.4 to 2.2. When COOH/N is from 0.1 to 3.0, a film having a crosslinked structure such as amide or imide between a compound (A) and a crosslinking agent (B) after the heat treatment, and having excellent heat resistance and insulating properties can be produced by using a semiconductor film composition.

In a case in which at least one selected from the group consisting of an aliphatic amine having a weight average molecular weight of from 10,000 to 400,000 and an amine compound having a ring structure in the molecule and having a weight average molecular weight of from 90 to 600 described below is further contained as a component other than the compound (A) and the crosslinking agent (B), the ratio (COOH/N) of the number of carboxy groups in the crosslinking agent (B) to the total number of all the nitrogen atoms contained in these and all the nitrogen atoms contained in the compound (A) is preferably from 0.1 to 3.0.

(Polar Solvent (D))

The composition according to the embodiment contains a polar solvent (D). Here, the polar solvent (D) refers to a solvent having a relative dielectric constant of 5 or more at room temperature. Specific examples of the polar solvent (D) include a protic inorganic compound such as water or heavy water; an alcohol such as methanol, ethanol, 1-propanol, 2-propanol, 1-butanol, 2-butanol, isobutyl alcohol, isopentyl alcohol, cyclohexanol, ethylene glycol, propylene glycol, 2-methoxyethanol, 2-ethoxyethanol, benzyl alcohol, diethylene glycol, triethylene glycol, or glycerin; an ether such as tetrahydrofuran or dimethoxyethane; an aldehyde or ketone such as furfural, acetone, ethyl methyl ketone, or cyclohexanone; an acid derivative such as acetic anhydride, ethyl acetate, butyl acetate, ethylene carbonate, propylene carbonate, formaldehyde, N-methylformamide, N,N-dimethylformamide, N-methylacetamide, N,N-dimethylacetamide, N-methyl-2-pyrrolidone, or hexamethylphosphoramide; a nitrile such as acetonitrile or propionitrile; a nitro compound such as nitromethane or nitrobenzene; or a sulfur compound such as dimethylsulfoxide. The polar solvent (D) preferably contains a protic solvent, more preferably contains water, and still more preferably contains ultrapure water.

The content of the polar solvent (D) in the composition is not particularly limited, and is, for example, with respect to the total composition, from 1.0% by mass to 99.99896% by mass, and is preferably from 40% by mass to 99.99896% by mass.

(Additive (C))

The composition according to the embodiment may contain an additive (C) in addition to the compound (A), the crosslinking agent (B), and the polar solvent (D) described above. Examples of the additive (C) include an acid (C-1) having a carboxy group and having a weight average molecular weight of from 46 to 195, and a base (C-2) having a nitrogen atom and having a weight average molecular weight of from 17 to 120.

The acid (C-1) is an acid having a carboxy group and having a weight average molecular weight of from 46 to 195. It is presumed that, since the composition according to the embodiment contains the acid (C-1) as the additive (C), aggregation due to association of the compound (A) and the crosslinking agent (B) is inhibited by ionic bonding of an amino group in the compound (A) and a carboxyl group in the acid (C-1). More specifically, since the interaction (for example, electrostatic interaction) between an ammonium ion derived from an amino group in the compound (A) and a carboxylate ion derived from a carboxy group in the acid (C-1) is stronger than the interaction between an ammonium ion derived from an amino group in the compound (A) and a carboxylate ion derived from a carboxy group in the crosslinking agent (B), aggregation is assumed to be suppressed. It should be noted that the invention is not limited at all by the above assumption.

The acid (C-1) is not particularly limited as long as the acid has a carboxy group and has a weight average molecular weight of from 46 to 195, and examples thereof include a monocarboxylic acid compound, a dicarboxylic acid compound, and an oxydicarboxylic acid compound. More specific examples of the acid (C-1) include a formic acid, an acetic acid, a malonic acid, an oxalic acid, a citric acid, a benzoic acid, a lactic acid, a glycolic acid, a glyceric acid, a butyric acid, a methoxyacetic acid, an ethoxyacetic acid, a phthalic acid, a terephthalic acid, a picolinic acid, a salicylic acid, and a 3,4,5-trihydroxybenzoic acid.

In the embodiment, the content of the acid (C-1) in the composition is not particularly limited, and, for example, the ratio (COOH/N) of the number of carboxy groups in the acid (C-1) to the total number of nitrogen atoms in the compound (A) is preferably from 0.01 to 10, more preferably from 0.02 to 6, and still more preferably from 0.5 to 3. In a case in which at least one selected from the group consisting of an aliphatic amine having a weight average molecular weight of from 10,000 to 400,000 and an amine compound having a ring structure in the molecule and having a weight average molecular weight of from 90 to 600 described below is further contained as a component other than the compound (A) and the crosslinking agent (B), the ratio (COOH/N) of the number of carboxy groups in the acid (C-1) to the total number of all the nitrogen atoms contained in these and all the nitrogen atoms contained in the compound (A) is preferably from 0.01 to 10.

The base (C-2) is a base having a nitrogen atom and having a weight average molecular weight of from 17 to 120. It is presumed that, since the composition according to the embodiment contains the base (C-2) as the additive (C), aggregation due to association of the compound (A) and the crosslinking agent (B) is inhibited by ionic bonding of a carboxy group in the crosslinking agent (B) and an amino group in the base (C-2). More specifically, since the interaction between a carboxylate ion derived from a carboxy group in the crosslinking agent (B) and an ammonium ion derived from an amino group in the base (C-2) is stronger than the interaction between an ammonium ion derived from an amino group in the compound (A) and a carboxylate ion derived from a carboxy group in the crosslinking agent (B), aggregation is assumed to be suppressed. It should be noted that the invention is not limited at all by the above assumption.

The base (C-2) is not particularly limited as long as the base has a nitrogen atom and has a weight average molecular weight of from 17 to 120, and examples thereof include a monoamine compound and a diamine compound. More specific examples of the base (C-2) include ammonia, ethylamine, ethanolamine, diethylamine, triethylamine, ethylenediamine, N-acetylethylenediamine, N-(2-aminoethyl)ethanolamine, and N-(2-aminoethyl)glycine.

In the embodiment, the content of the base (C-2) in the composition is not particularly limited, and for example, the ratio (N/COOH) of the number of nitrogen atoms in the base (C-2) to the number of carboxy groups in the crosslinking agent (B) is preferably from 0.5 to 5, and more preferably from 0.9 to 3.

(Other Components)

The content of sodium and potassium in the composition according to the embodiment is preferably 10 mass ppb or less on an element basis. When the content of sodium or potassium is 10 mass ppb or less on an element basis, occurrence of inconvenience in the electrical characteristics of a semiconductor device such as malfunction of a transistor can be suppressed.

A composition may further contain at least one selected from the group consisting of an aliphatic amine having a weight average molecular weight of from 10,000 to 400,000 and an amine compound having a ring structure in the molecule and having a weight average molecular weight of from 90 to 600.

The aliphatic amine having a weight average molecular weight of from 10,000 to 400,000 preferably has a cationic functional group containing at least one of a primary nitrogen atom or a secondary nitrogen atom. Specific examples of the aliphatic amine having a weight average molecular weight of from 10,000 to 400,000 include polyalkyleneimine which is a polymer of alkyleneimine such as ethylene imine, propylene imine, butylene imine, pentylene imine, hexylene imine, heptylene imine, octylene imine, trimethylene imine, tetramethylene imine, pentamethylene imine, hexamethylene imine, or octamethylene imine; polyallylamine; and polyacrylamide.

Polyethyleneimine (PEI) can be prepared by a known method described in Japanese Patent Publication (JP-B) No. S43-8828, JP-B No. S49-33120, Japanese Patent Application Laid-Open (JP-A) No. 2001-2123958, WO 2010/137711, or the like. Polyalkyleneimines other than polyethyleneimine can also be prepared by a similar method to that of polyethyleneimine.

It is also preferable that the aliphatic amine having a weight average molecular weight of from 10,000 to 400,000 is a derivative of the above-described polyalkyleneimine (polyalkyleneimine derivative; particularly preferably polyethyleneimine derivative). The derivative of polyalkyleneimine is not particularly limited as long as the derivative is a compound which can be produced using the polyalkyleneimine described above. Specific examples thereof include a derivative of polyalkyleneimine in which an alkyl group (preferably an alkyl group having from 1 to 10 carbon atoms) or an aryl group is introduced into a polyalkyleneimine, and a derivative of polyalkyleneimine obtained by introducing a crosslinkable group such as a hydroxyl group into a polyalkyleneimine.

These derivatives of polyalkyleneimine can be produced by a method performed commonly using the polyalkyleneimine described above. Specifically, these derivatives of polyalkyleneimine can be produced based on the method described in, for example, JP-A No. H06-016809, or the like.

As a derivative of polyalkyleneimine, a highly branched type polyalkyleneimine obtained by increasing the branching degree of a polyalkyleneimine by reacting the polyalkyleneimine with a cationic functional group-containing monomer is also preferable.

Examples of the method of obtaining a highly branched type polyalkyleneimine include a method in which a polyalkyleneimine containing plural secondary nitrogen atoms in the backbone is reacted with a cationic functional group-containing monomer and thus at least a part of the plural secondary nitrogen atoms are substituted with the cationic functional group-containing monomer, and a method in which a polyalkyleneimine containing plural primary nitrogen atoms at terminals is reacted with a cationic functional group-containing monomer and thus at least a part of the plural primary nitrogen atoms are substituted with the cationic functional group-containing monomer.

Examples of the cationic functional group introduced in order to increase the branching degree include an aminoethyl group, an aminopropyl group, a diaminopropyl group, an aminobutyl group, a diaminobutyl group, and a triaminobutyl group, and an aminoethyl group is preferable from the viewpoint of decreasing the cationic functional group equivalent weight and increasing the cationic functional group density.

The aliphatic amine having a weight average molecular weight of from 10,000 to 400,000 preferably has a cationic functional group containing at least one of a primary nitrogen atom or a secondary nitrogen atom. Here, when the aliphatic amine contains primary nitrogen atoms, the proportion of the primary nitrogen atoms in the total nitrogen atoms in the aliphatic amine is preferably 20% by mole or more, more preferably 25% by mole or more, and still more preferably 30% by mole or more. The aliphatic amine may have a cationic functional group containing a primary nitrogen atom and containing no nitrogen atom (for example, a secondary nitrogen atom or a tertiary nitrogen atom) other than the primary nitrogen atom.

When the aliphatic amine contains a secondary nitrogen atom, the proportion of the secondary nitrogen atoms in the total nitrogen atoms in the aliphatic amine is preferably from 5% by mole to 50% by mole, and more preferably from 10% by mole to 45% by mole.

The aliphatic amine may contain a tertiary nitrogen atom in addition to the primary nitrogen atom and the secondary nitrogen atom, and when the aliphatic amine contains a tertiary nitrogen atom, the proportion of the tertiary nitrogen atoms in the total nitrogen atoms in the aliphatic amine is preferably from 20% by mole to 50% by moles, and is preferably from 25% by mole to 45% by mole.

The polyethyleneimine and a derivative thereof may be a commercially available product. For example, the polyethyleneimine and a derivative thereof may be selected from those commercially available from NIPPON SHOKUBAI CO., LTD., BASF SE, MP Biomedicals, LLC., or the like if appropriate and used.

Examples of the amine compound having a ring structure in the molecule having a weight average molecular weight of from 90 to 600 include an alicyclic amine, an aromatic ring amine, and a heterocyclic (aminocyclic) amine. The ring structure may have a plurality of ring structures in the molecule, and the plurality of ring structures may be the same or different. As the amine compound having a ring structure, an amine compound having an aromatic ring is more preferable since a thermally more stable compound is easily obtained.

An amine compound having a ring structure in the molecule and having a weight average molecular weight of from 90 to 600 is preferably a compound having a primary amino group from the viewpoint of easily forming a thermally crosslinked structure such as imide, imide amide, or amide with the crosslinking agent (B) and enhancing the heat resistance. From the viewpoint of easily increasing the number of thermally crosslinked structures such as imide, imide amide, or amide with the crosslinking agent (B) and further enhancing the heat resistance, the amine compound is preferably a diamine compound having two primary amino groups, a triamine compound having three primary amino groups or the like.

Examples of the alicyclic amine include cyclohexylamine and dimethylaminocyclohexane.

Examples of the aromatic ring amine include diaminodiphenyl ether, xylenediamine (preferably paraxylenediamine), diaminobenzene, diaminotoluene, methylenedianiline, dimethyldiaminobiphenyl, bis (trifluoromethyl) diaminobiphenyl, diaminobenzophenone, diaminobenzanilide, bis(aminophenyl)fluorene, bis(aminophenoxy)benzene, bis(aminophenoxy)biphenyl, dicarboxydiaminodiphenylmethane, diaminoresorcin, dihydroxybenzidine, diaminobenzidine, 1,3,5-triaminophenoxybenzene, 2,2'-dimethylbenzidine, and tris(4-aminophenyl) amine.

Examples of the heterocyclic ring of a heterocyclic amine include a heterocyclic ring (for example, a thiophene ring) containing a sulfur atom as a hetero atom, or a heterocyclic ring containing a nitrogen atom as a heteroatom (for example, a 5-membered ring such as a pyrrole ring, a pyrrolidine ring, a pyrazole ring, an imidazole ring, or a triazole ring; a 6-membered ring such as an isocyanuryl ring, a pyridine ring, a pyridazine ring, a pyrimidine ring, a pyrazine ring, a piperidine ring, a piperazine ring, or a triazine ring; or a condensed ring such as an indole ring, an indoline ring, a quinoline ring, an acridine ring, a naphthyridine ring, a quinazoline ring, a purine ring, or a quinoxaline ring).

Examples of heterocyclic amines having a nitrogen-containing heterocyclic ring include melamine, ammeline, melam, melem, and tris(4-aminophenyl) amine.

Examples of amine compounds having both a heterocyclic ring and an aromatic ring include N2,N4,N6-tris(4-aminophenyl)-1,3,5-triazine-2,4,6-triamine.

When the selectivity of plasma etching resistance is demanded (for example, when used as a gap fill material or a buried insulating film) for the composition according to the embodiment, a metal alkoxide represented by Formula (I) may be contained.

$$R1_n M(OR2)_{m-n} \quad (I)$$

(wherein R1 is a nonhydrolyzable group; R2 is an alkyl group having from 1 to 6 carbon atoms; M represents at least one metal atom selected from the metal atom group consisting of Ti, Al, Zr, Sr, Ba, Zn, B, Ga, Y, Ge, Pb, P, Sb, V, Ta, W, La, Nd, and In; m is the valence of the metal atom M which is 3 or 4; n is an integer from 0 to 2 in a case in which m is 4, and 0 or 1 in a case in which m is 3; when there are a plurality of R1s, the R1s may be the same or different; and when there are a plurality of OR2s, the OR2 may be the same or different.)

In a case in which insulation is demanded for a film manufactured from the composition according to the embodiment (for example, an application for a through-silicon via insulating film or an application of a buried insulating film), in order to improve insulation or mechanical strength, tetraethoxysilane, tetramethoxysilane, bistriethoxysilylethane, bistriethoxysilylmethane, bis (methyldiethoxysilyl) ethane, 1,1,3,3,5,5-hexaethoxy-1,3,5-trisilacyclohexane, 1,3,5,7-tetramethyl-1,3,5,7-tetrahydroxylcyclosiloxane, 1,1,4,4-tetramethyl-1,4-diethoxydisylethylene, or 1,3,5-trimethyl-1,3,5-triethoxy-1,3,5-trisilacyclohexane may be mixed therein. Furthermore, in order to improve the hydrophobicity of the insulating film, methyltriethoxysilane, dimethyldiethoxysilane, trimethylethoxysilane, or the like may be mixed therein. These compounds may be mixed for control of etching selectivity.

The composition according to the embodiment may contain a solvent other than the polar solvent (D), and examples thereof include normal hexane.

The composition according to the embodiment may contain a phthalic acid, a benzoic acid, or the like, or a derivative thereof, for example, for improving electric characteristics.

The composition according to the embodiment may contain benzotriazole or a derivative thereof, for example, for suppressing corrosion of copper.

The pH of the composition according to the embodiment is not particularly limited, and is preferably from 2.0 to 12.0

[Method of Manufacturing Composition]

Hereinafter, a method of manufacturing a composition according to an embodiment of the invention will be described. The method of producing a composition according to the embodiment includes a mixing step of mixing a compound (A) and a crosslinking agent (B). As described above, the composition contains polar solvent (D), and polar solvent (D) may be added to the compound (A), the crosslinking agent (B), and a mixture of the compound (A) and the crosslinking agent (B) at an arbitrary timing for manufacturing the composition. The timing of adding the other components is also not particularly limited.

In the method of manufacturing a composition according to the embodiment, at least one additive (C) selected from the group consisting of an acid (C-1) having a carboxy group and having a weight average molecular weight of from 46 to 195 and the base (C-2) having a nitrogen atom and having a weight average molecular weight of from 17 to 120 may be added to the compound (A) or the crosslinking agent (B) in a mixing step. The timing of adding the additive (C) is not particularly limited.

When an acid (C-1) is added as an additive (C), the mixing step is preferably a step of mixing a mixture of the acid (C-1) and the compound (A) and the crosslinking agent (B). In other words, the compound (A) and the acid (C-1) are preferably mixed in advance before mixing the compound (A) and the crosslinking agent (B). By this, when the compound (A) and the crosslinking agent (B) are mixed, whitening and gelation (gelation is not preferable because it may take time to make the composition transparent) of a composition can be suitably suppressed.

When the base (C-2) is added as the additive (C), the mixing step is preferably a step of mixing the mixture of the base (C-2) and the crosslinking agent (B) with the compound (A). In other words, it is preferable to previously mix the crosslinking agent (B) and the base (C-2) before mixing the compound (A) and the crosslinking agent (B). By this, when the compound (A) and the crosslinking agent (B) are mixed, whitening and gelation (gelation is not preferable because it may take time to make the composition transparent) of a composition can be suitably suppressed.

[Method of Manufacturing Semiconductor Member]

Hereinafter, a method of manufacturing the semiconductor member according to the embodiment will be described. A method of manufacturing a semiconductor member according to the embodiment includes an application step of applying a composition to a substrate and a heating step of heating a substrate to which a composition is applied at a temperature of from 250° C. to 425° C.

<Applying Step>

The applying step in the embodiment is a step of applying a composition to a substrate.

Examples of the substrate include a semiconductor substrate such as a silicon substrate, a glass substrate, a quartz substrate, a stainless substrate, and a plastic substrate. The shape of the substrate is also not particularly limited, and may be any of a plate shape or a dish shape. For example, the silicon substrate may be a silicon substrate on which an interlayer insulating layer (low-k film) is formed, and in the silicon substrate, fine grooves (recesses), fine through holes, or the like may be formed.

In the applying step in the embodiment, the method of applying a composition is not particularly limited, and a commonly used method can be used.

Examples of commonly used methods include a dipping method, a spraying method, a spin coating method, and a bar coating method. For example, when forming a film having a thickness of microns, it is preferable to use a bar coating method, and in a case in which a film having a film thickness of nano size (several nm to several hundred nm) is formed, it is preferable to use a spin coating method.

For example, the method of applying a composition by a spin coating method is not particularly limited, and for example, a method of dropping a composition onto the surface of a substrate while rotating the substrate with a spin coater, then increasing the number of revolutions of the substrate and drying can be used.

In a method of applying a composition by a spin coating method, a condition such as the number of revolutions of a substrate, the dropping amount and dropping time of a composition, or the number of revolutions of a substrate at the time of drying is not particularly limited, and can be adjusted if appropriate in consideration of the thickness of a film to be formed and the like.

<Drying Step>

The manufacturing method according to the embodiment may include a drying step of drying a substrate to which a composition is applied at a temperature of from 80° C. to 250° C., before a heating step described below. The temperature refers to the temperature of the surface of a substrate to which a composition is applied.

The above temperature is more preferably from 90° C. to 200° C., and more preferably from 100° C. to 150° C.

Drying in this step can be carried out by a usual method, for example, drying can be carried out using a hot plate.

There are no particular restrictions on the atmosphere to be dried in this step, and for example, drying may be performed in an air atmosphere or in an atmosphere of an inert gas (nitrogen gas, argon gas, helium gas, or the like).

The drying time is not particularly limited, and is preferably 300 seconds or less, more preferably 200 seconds or less, still more preferably 120 seconds or less, and particularly preferably 80 seconds or less.

The lower limit of the drying time is not particularly limited, and the lower limit may be, for example, 10 seconds (preferably 20 seconds, and more preferably 30 seconds).

<Washing Step>

The manufacturing method according to the embodiment may include a washing step of washing a substrate to which a composition is applied with water or the like in order to remove excessive composition applied to a substrate before a heating step described below. In a case in which the manufacturing method according to the embodiment has the above-described drying step, a washing step is preferably performed after the drying step.

<Heating Step>

The manufacturing method according to the embodiment further includes a heating step of heating a substrate to which a composition is applied under a condition of a temperature of from 200° C. to 425° C.

The temperature refers to a temperature of the surface of a substrate to which a composition is applied.

By including such a heating step, the compound (A) and the crosslinking agent (B) react by heating to obtain a reaction product, and a film containing the reaction product is formed.

The temperature is preferably from 250° C. to 400° C., and more preferably from 300° C. to 400° C.

There is no particular limitation on the pressure at which heating is performed in the heating step, and heating is preferably performed at an absolute pressure of higher than 17 Pa and equal to or lower than the atmospheric pressure.

The absolute pressure is more preferably from 1,000 Pa to atmospheric pressure, still more preferably from 5,000 Pa to atmospheric pressure, and particularly preferably from 10,000 Pa to atmospheric pressure.

Heating in the heating step can be carried out by a usual method using a furnace or a hot plate. As the furnace, for example, SPX-1120 manufactured by APPEX CORPORATION, VF-1000LP manufactured by Koyo Thermo Systems Co., Ltd., or the like can be used.

Heating in this step may be carried out under an air atmosphere or under an atmosphere of an inert gas (nitrogen gas, argon gas, helium gas, or the like).

The heating time in the heating step is not particularly limited, and the heating time is, for example, 1 hour or less, preferably 30 minutes or less, more preferably 10 minutes or less, and particularly preferably 5 minutes or less. The lower limit of the heating time is not particularly limited, and may be, for example, 0.1 minutes.

For the purpose of shortening the heating process time, ultraviolet irradiation may be performed on the surface of a substrate to which a composition is applied.

As ultraviolet rays, an ultraviolet light having a wavelength of from 170 nm to 230 nm, an excimer light having a wavelength of 222 nm, an excimer light having a wavelength of 172 nm, or the like is preferable. Ultraviolet irradiation is preferably performed in an inert gas atmosphere.

<Example of Semiconductor Member>

Examples of the semiconductor member include a semiconductor member in which a gap fill material (buried planarization film) is filled in a recess formed in a substrate, a semiconductor member in which an insulating material (buried insulating film) is filled in a recess formed in a substrate, a semiconductor member provided with a barrier material (barrier film) having insulating properties, adhesiveness, pore sealing property, or the like between a substrate containing a low dielectric constant material such as a porous material and a metal, a semiconductor member provided with an insulating film (through-silicon via insulating film) having adhesiveness and insulating properties provided between a metal and a silicon substrate or between a metal and an insulating film on a via sidewall of a through-silicon via substrate, and a semiconductor member for forming a reverse resist.

In a semiconductor member in which a recess formed in a substrate is filled with a buried planarization film, the thickness of the buried planarization film is, for example, from 30 nm to 200 nm, and preferably from 50 nm to 150 nm.

Such a semiconductor member can be used as a member in which a buried planarization film is provided in a via, for example, in a via first process when a copper multilayer wiring is formed by a dual damascene process.

In a case in which a buried planarization film is formed in a groove having a narrow width and a large aspect ratio (depth/width), from the viewpoint of enhancing the filling property to the groove, it is preferable to form a buried planarization film by applying a composition according to the embodiment to a recess (preferably, applying by a spin coating method).

In a semiconductor member in which a recess formed in a substrate is filled with a buried insulating film, the thickness of the buried insulating film is, for example, from 30 nm to 200 nm, and preferably from 50 nm to 150 nm.

Examples of the semiconductor member include a member using a technique (STI: shallow trench isolation) of forming an element isolation region by providing a buried insulating film having insulation in a groove of a silicon substrate, a member provided between switching elements such as a metal-oxide-semiconductor field-effect transistor (MOSFET) formed in advance with a buried insulating film having insulation, a member provided with a buried insulating film having insulation as a pre-metal insulating film (PMD) on a MOSFET, a member provided between the lowermost wirings (W, Ti/TiN/AlCu/TiN or the like) formed in advance with a buried insulating film having insulation, a member provided with an insulating film having insulation as an intermetal insulating film (IMD) on the lowermost layer wiring, and a member provided with a buried insulating film having insulation as an inter-wiring layer insulating film (ILD) in a groove between copper wirings formed in advance.

In a case in which a buried insulating film is formed in a groove having a narrow width and a large aspect ratio (depth/width), from the viewpoint of enhancing the filling property to the groove, it is preferable to form a buried insulating film by applying a composition according to the embodiment to a recess (preferably by a spin coating method).

In a semiconductor member in which a barrier film having insulation, adhesiveness, pore sealing property, and the like is provided between a substrate containing a low dielectric constant material such as a porous material and a metal, the thickness of the barrier film is, for example, from 0.5 nm to 15 nm, and preferably from 1.5 nm to 12 nm. The semiconductor member may be, for example, a member in which a barrier film serving as an adhesion layer is provided between a wall surface of a through hole formed in a substrate and a metal disposed in the through hole.

In a semiconductor member in which a through-silicon via insulating film is provided between a metal and a silicon substrate at the via sidewall of a through-silicon via substrate, the thickness of the through-silicon via insulating film is, for example, from 100 nm to 5 μm, and preferably from 500 nm to 2 μm.

In a semiconductor member in which a through-silicon via insulating film is provided between a metal and a insulating film at the via sidewall of a through-silicon via substrate, the thickness of the through-silicon via insulating film is, for example, from 0.5 nm to 100 nm, and preferably from 1 nm to 30 nm.

[Method of Manufacturing Semiconductor Processing Material]

Hereinafter, a method of manufacturing a semiconductor processing material according to the embodiment will be described. A method of manufacturing a semiconductor processing material according to the embodiment includes an application step of applying a composition to a substrate and a heating step of heating a substrate to which a composition is applied under a condition of a temperature of from 250° C. to 425° C.

Since each step of the method of manufacturing a semiconductor processing material is similar to each step of the above-described method of manufacturing a semiconductor member, the description thereof will be omitted.

Examples of the semiconductor processing material include a sacrificial film temporarily formed in a manufacturing process of a semiconductor device and removed in a later step.

[Semiconductor Device]

Hereinafter, a semiconductor device according to the embodiment will be described.

The semiconductor device according to the embodiment includes a reaction product of: a substrate; a compound (A) including a Si—O bond and a cationic functional group containing at least one of a primary nitrogen atom or a secondary nitrogen atom and having a weight average molecular weight of from 130 to 10,000; and a crosslinking agent (B) which includes three or more —C(=O)OX groups (X is a hydrogen atom or an alkyl group having from 1 to 6 carbon atoms) in a molecule, in which from one to six of the three or more —C(=O)OX groups are —C(=O)OH groups, and which has a weight average molecular weight of from 200 to 600. The reaction product of the compound (A) and the crosslinking agent (B) has high smoothness and is excellent in composition uniformity in the film thickness direction.

The reaction product of the compound (A) and the crosslinking agent (B) preferably has at least one of an amide bond or an imide bond.

EXAMPLES

Hereinafter, the invention will be specifically described with reference to Examples, but the invention is not limited to these Examples.

In the following, water was used when a solvent is not indicated.

In the following, ultrapure water (MILLI-Q water manufactured by Millipore Corporation, resistance of 18 MΩ·cm (25° C.) or less was used as "water".

The compositions of Examples A1 to C1 were prepared. Details are as follows.

Mixing of each of a solution of the compound (A), a solution of the crosslinking agent (B), and a solution obtained by adding the base (C-2) to the crosslinking agent (B) was carried out after confirming that there was no precipitate in each solution to be mixed.

Examples A1 to A8

As 3-aminopropyltriethoxysilane (3APTES; (3-Aminopropyl) triethoxysilane) used in this Example, 25 g of 3-aminopropyltriethoxysilane was added dropwise to 25 g of water, dissolved to 50% by mass, and after standing overnight at room temperature, it was confirmed that the alkoxysilane was hydrolyzed by proton NMR spectrum. Next, a 3APTES aqueous solution was prepared in such a manner to have a concentration shown in Table 1.

1,3,5-benzenetricarboxylic acid (135BTC), 1,2,4-benzenetricarboxylic acid (124BTC; 1,2,4-benzeneetricarboxylic acid), pyromellitic acid (PMA), ethyl half ester pyromellitic acid (ehePMA; ethyl half ester PMA), and 1-propyl half ester 1, 2, 4-benzene tricarboxylic acid (1Prhe124BTC; 1-propyl half ester 124BTC) were prepared as the crosslinking agent (B).

ehePMA was prepared by adding pyromellitic dianhydride to ethanol and heating for 3 hours and 30 minutes on a water bath heated to 50° C. to completely dissolve the pyromellitic dianhydride powder. That an ester group was formed in the prepared ehePMA was confirmed by proton NMR.

1Prhe124BTC was prepared by adding 124BTC anhydride to 1-propanol, stirring at room temperature to completely dissolve the 124BTC anhydride powder. That an ester group was formed in the prepared 1Prhe124BTC was confirmed by proton NMR.

In Examples A1, A3, A5, A7, and A8, an ethanol (EtOH) solution, an aqueous solution, or a 1-propanol (1PrOH) solution of the crosslinking agent (B) having the concentration shown in Table 1 was prepared without adding the base (C-2) to the crosslinking agent (B), and each was added dropwise to 3APTES aqueous solution until the ratio (COOH/N) of the number of carboxy groups in the crosslinking agent (B) to the total number of nitrogen atoms in the compound (A) reached from 1 to 2 ("COOH/N range performed" in Table 1).

In Examples A2, A4, and A6, ammonia as the base (C-2) was added to 135BTC, 124BTC, or PMA as the crosslinking agent (B) until the ratio (N/COOH) of the number of nitrogen atoms in the base (C-2) to the number of carboxy groups in the crosslinking agent (B) reached 1.5, and then an aqueous solution (9.5% by mass) of 135BTC, 124BTC, or PMA was prepared. Subsequently, an aqueous solution of 135BTC, 124BTC, or PMA was added dropwise to 3APTES aqueous solution until the ratio (COOH/N) of the number of carboxy groups in the crosslinking agent (B) to the total number of nitrogen atoms in the compound (A) reached from 1 to 2 ("COOH/N range performed" in Table 1).

In cases in which a solution of the crosslinking agent (B) was added dropwise into 3APTES aqueous solution in Examples A1 to A8, the dropping amount of the crosslinking agent (B) when a solution to which a solution of the crosslinking agent (B) was added dropwise became cloudy (aggregated) was evaluated by determining the ratio (COOH/N) of the number of carboxy groups in the crosslinking agent (B) to the total number of nitrogen atoms in the compound (A). The results are shown in Table 1 "COOH/N range where the composition was transparent".

Whether or not the solution was cloudy was visually confirmed.

Example B1 to B5

As (3-aminopropyl) trimethoxysilane (3APTS) used in the Example, 25 g of (3-aminopropyl)trimethoxysilane was added dropwise to 25 g of water to dissolve to 50% by mass, and after standing overnight at room temperature, it was confirmed that alkoxysilane was hydrolyzed by proton NMR spectrum. Subsequently, a 3APTS aqueous solution was prepared so as to have the concentration shown in Table 1. In the 3APTS aqueous solution, hydrolysates of 3-aminopropyltrimethoxysilane or siloxane polymers thereof may be present.

As the crosslinking agent (B), 135BTC, ehePMA, and ethyl half ester 1,2,4-benzene tricarboxylic acid (ehe124BTC; ethyl half ester 124BTC) were prepared.

ehe124BTC was prepared by adding 124BTC anhydride to ethanol, stirring at room temperature, and completely dissolving 124BTC anhydride powder. By proton NMR, it was confirmed that an ester group was formed in the produced ehe124BTC.

In Examples B1, B4, and B5, an ethanol solution of the crosslinking agent (B) having the concentration shown in Table 1 was prepared without adding the base (C-2) to the crosslinking agent (B), and the ethanol solution of the crosslinking agent (B) was added dropwise to the 3APTS aqueous solution until the ratio (COOH/N) of the number of carboxy groups in the crosslinking agent (B) to the total number of nitrogen atoms in the compound (A) reached 1.

In Examples B2 and B3, ammonia as the base (C-2) was added to 135BTC as the crosslinking agent (B) until the ratio (N/COOH) of the number of nitrogen atoms in the base (C-2) to the number of carboxy groups in the crosslinking agent (B) reached 2.0, and then a 135BTC aqueous solution (10.1% by mass) was prepared. Subsequently, the 135BTC aqueous solution was added dropwise to the 3APTS aqueous solution until the ratio (COOH/N) of the number of carboxy groups in the crosslinking agent (B) to the total number of nitrogen atoms in the compound (A) reached 1.

In cases in which a solution of the crosslinking agent (B) was added dropwise into 3APTS aqueous solution in Examples B1 to B5, the dropping amount of the crosslinking agent (B) when a solution to which a solution of the crosslinking agent (B) was added dropwise became cloudy (aggregated) was evaluated by determining the ratio (COOH/N) of the number of carboxy groups in the crosslinking agent (B) to the total number of nitrogen atoms in the compound (A). The results are shown in Table 1 "COOH/N range where the composition was transparent".

Whether or not the solution was cloudy was visually confirmed.

Example C1

1,3-bis(3-aminopropyl)-tetramethyldisiloxane (BATDS; corresponding to the compound (A)) was dissolved in a mixed solvent (ethanol/water=0.24, based on mass)) to prepare a BATDS solution (2% by mass), and 135BTC ethanol solution (9.5% by mass) was prepared.

Subsequently, 135BTC ethanol solution was added dropwise to the BATDS aqueous solution (2% by mass) until the ratio (COOH/N) of the number of carboxy groups in the crosslinking agent (B) to the total number of nitrogen atoms in the compound (A) reached 1, and a composition was prepared.

In a case in which a 135BTC ethanol solution was added dropwise into the BATDS aqueous solution in Example C1, the dropping amount of the 135BTC when a solution to which the 135BTC solution was added dropwise became cloudy (aggregated) was evaluated by determining the ratio (COOH/N) of the number of carboxy groups in the crosslinking agent (B) to the total number of nitrogen atoms in the compound (A). The results are shown in Table 1 "COOH/N range where the composition was transparent".

Whether or not the solution was cloudy was visually confirmed.

The compositions and the like of the compositions obtained in the respective Examples are as shown in the following Table 1.

The parenthesis in the item "type of compound (A)" represents the concentration of the compound (A) in a solution of the compound (A).

"Concentration in composition" of the compound (A) represents the concentration of the compound (A) with respect to the total composition when the crosslinking agent (B) was dropped in such a manner that the ratio "COOH/N" of the number of carboxy groups in the crosslinking agent (B) to the total number of nitrogen atoms in the compound (A) was the maximum value.

The parenthesis in the item "type of crosslinking agent (B)" represents the concentration of the crosslinking agent (B) in a solution of the crosslinking agent (B), and in a case in which the base (C-2) was added dropwise to the crosslinking agent (B), the parenthesis represents the concentration of the crosslinking agent (B) in the solution of the crosslinking agent (B) after dropping of the base (C-2).

In Examples A1 to A8, since 3-aminopropyltriethoxysilane (3APTES) used as the compound (A) contains one primary nitrogen atom in one molecule, 3APTES was described as primary nitrogen atom/secondary nitrogen atom/tertiary nitrogen atom=1/0/0. In solution, 3APTES may be a hydrolyzate or a siloxane polymer.

In Examples B1 to B5, since 3-aminopropyltrimethoxysilane (3APTS) used as compound (A) contains one primary nitrogen atom in one molecule, 3APTS was described as primary nitrogen atom/secondary nitrogen atom/tertiary nitrogen atom=1/0/0. In solution, the 3APTS may be a hydrolyzate or a siloxane polymer.

Further, in Example C1, since 1,3-bis (3-aminopropyl)-tetramethyldisiloxane (BATDS) used as the compound (A) contains two primary nitrogen atoms in one molecule, BATDS was described as primary nitrogen atom/secondary nitrogen atom/tertiary nitrogen atom=2/0/0.

TABLE 1

| | Compound (A) | | | Crosslinking agent (B) | | | | COOH/N range where composition was transparent |
|---|---|---|---|---|---|---|---|---|
| | Type | Concentration in composition (% by mass) | Molar ratio of primary nitrogen atom/ secondary nitrogen atom/ tertiary nitrogen atom | Type | Number of COOH | Base (C-2) | COOH/N range performed | |
| Example A1 | 3APTES aqueous solution (5% by mass) | 4.5 | 1/0/0 | 135BTC EtOH solution (9.5% by mass) | 3 | | 0-1 | 0-1 |
| Example A2 | 3APTES aqueous solution (5% by mass) | 4.5 | 1/0/0 | 135BTC aqueous solution (9.5% by mass) | 3 | NH3[1.5] | 0-1 | 0-1 |
| Example A3 | 3APTES aqueous solution (5% by mass) | 4.1 | 1/0/0 | 124BTC EtOH solution (9.5% by mass) | 3 | | 0-1.5 | 0-0.7 |
| Example A4 | 3APTES aqueous solution (5% by mass) | 4.1 | 1/0/0 | 124BTC aqueous solution (9.5% by mass) | 3 | NH3[1.5] | 0-1.5 | 0-1.5 |
| Example A5 | 3APTES aqueous solution (5% by mass) | 3.8 | 1/0/0 | PMA EtOH solution (9.5% by mass) | 4 | | 0-2 | 0-0.79 |
| Example A6 | 3APTES aqueous solution (5% by mass) | 3.8 | 1/0/0 | PMA aqueous solution (9.5% by mass) | 4 | NH3[1.5] | 0-2 | 0-2 |
| Example A7 | 3APTES aqueous solution (5% by mass) | 3.2 | 1/0/0 | ehePMA EtOH solution (6.4% by mass) | 2 | | 0-1 | 0-1 |
| Example A8 | 3APTES aqueous solution (5% by mass) | 3.4 | 1/0/0 | 1Prhe124BTC 1PrOH solution (5.86% by mass) | 2 | | 0-1 | 0-1 |
| Example B1 | 3APTS aqueous solution (5% by mass) | 4.12 | 1/0/0 | 135BTC EtOH solution (9.5% by mass) | 3 | | 0-1 | 0-1 |
| Example B2 | 3APTS aqueous solution (50% by mass) | 16.6 | 1/0/0 | 135BTC aqueous solution (10.1% by mass) | 3 | NH3[2.0] | 0-1 | 0-1 |

TABLE 1-continued

| | Compound (A) | | | Crosslinking agent (B) | | | COOH/N range where composition was transparent |
|---|---|---|---|---|---|---|---|
| | Type | Concentration in composition (% by mass) | Molar ratio of primary nitrogen atom/ secondary nitrogen atom/ tertiary nitrogen atom | Type | Number of COOH | Base (C-2) | COOH/N range performed |
| Example B3 | 3APTS aqueous solution (5% by mass) | 4.16 | 1/0/0 | 135BTC aqueous solution (10.1% by mass) | 3 | NH3[2.0] | 0-1 | 0-1 |
| Example B4 | 3APTS aqueous solution (5% by mass) | 2.94 | 1/0/0 | ehePMA EtOH solution (6.4% by mass) | 2 | | 0-1 | 0-1 |
| Example B5 | 3APTS aqueous solution (5% by mass) | 3.09 | 1/0/0 | ehe124BTC EtOH solution (5.58% by mass) | 2 | | 0-1 | 0-1 |
| Example C1 | BATDS solution (mixed solvent of EtOH/H20 = 0.22, 2% by mass) | 1.79 | 2/0/0 | 135BTC EtOH solution (9.5% by mass) | 3 | | 0-1 | 0-1 |

In Example A1, the solution to which 135BTC was added dropwise when the ratio (COOH/N) of the number of carboxy groups in the crosslinking agent (B) to the total number of nitrogen atoms in the compound (A) was from 0 to 1 was transparent without cloudiness. In Examples A3 and A5, each solution to which 124BTC or PMA was added dropwise when COOH/N was over 0.7 or 0.79 respectively was cloudy. In other words, it was possible under a condition that COOH/N was 0.7 or less or 0.79 or less to prepare a composition in which agglomeration was suppressed without clouding. It is presumed that by forming a film using a composition in which agglomeration is suppressed without clouding, it is possible to form a smooth film with little unevenness.

In Examples A2, A4, and A6 in which the base (C-2) was added to the crosslinking agent (B), and Examples A7 and A8 in which the crosslinking agent (B) contained an ester bond, a solution to which each of the crosslinking agents (B) was added dropwise in all the ranges of the ratio (COOH/N) of the number of carboxy groups in the crosslinking agent (B) to the total number of nitrogen atoms in the compound (A) performed did not become cloudy, and the transparency of the composition was maintained.

It is presumed that by forming a film using a composition in which agglomeration is suppressed without clouding, it is possible to form a smooth film with little unevenness.

In Example B1 using 3-aminopropyltrimethoxysilane (3APTS) as the compound (A), it was found that even when the base (C-2) is not added to the crosslinking agent (B) and the crosslinking agent (B) has no ester bond, many crosslinking agents (B) can be added dropwise while maintaining the transparency of the composition.

In Examples B2 and B3 in which the base (C-2) was added to the crosslinking agent (B) and Examples B4 and B5 in which the crosslinking agent (B) contained the ester bond, the solution to which each of the crosslinking agents (B) was added dropwise in all the ranges of the ratio (COOH/N) of the number of carboxy groups in the crosslinking agent (B) to the total number of nitrogen atoms in the compound (A) performed did not become cloudy, and the transparency of the composition was maintained.

<Preparation of Composition>

Examples 1 to 17, Comparative Examples 1 to 3

A composition having composition and pH shown in Table 2 below was prepared. When the acid (C-1) was used as the additive (C), the acid (C-1) was added to a solution of the compound (A), and then the crosslinking agent (B) was mixed, and when the base (C-2) was used as the additive (C), a solution obtained by adding the base (C-2) to the crosslinking agent (B) and then dissolving the crosslinking agent (B) in a solvent was mixed with a solution of the compound (A).

In Table 2, the concentration of the compound (A) is the concentration of the compound (A) in a composition, and the concentration in parentheses in a solvent other than water is the concentration of a solvent other than water in the composition.

In Table 2, the concentration of "amine other than compound (A)" is the concentration of "amine other than compound (A)" in the composition.

In Table 2, the numeral value in parentheses in the crosslinking agent (B) or a COOX-containing compound other than the crosslinking agent (B) represents the ratio (COOH/N) of the number of carboxy groups in the crosslinking agent (B) to the total number of nitrogen atoms in the compound (A) or the ratio (COOX/N) of the number of COOX groups in a COOX-containing compound other than the crosslinking agent (B) to the total number of nitrogen atoms in the compound (A).

In Table 2, the numerical value in parentheses in the acid (C-1) represents the ratio (COOH/N) of the number of carboxy groups in the acid (C-1) to the total number of nitrogen atoms in the compound (A), and the numerical value in parentheses in the base (C-2) represent the ratio (N/COOH) of the number of nitrogen atoms in the base (C-2) to the number of carboxy groups in the crosslinking agent (B).

Example 1

3-aminopropyltriethoxysilane (3APTES) as the compound (A) was dissolved in water to prepare a 50% by weight aqueous solution, and after standing overnight, it was confirmed that the alkoxysilane was hydrolyzed by the proton NMR spectrum, and this was used for preparation of a composition. The weight average molecular weight (Mw) after hydrolysis was 430.

Ammonia as the base (C-2) and water were mixed with 135BTC as the crosslinking agent (B) to prepare a mixed solution of 135BTC (14% by mass) and ammonia. Ammonia was added in such a manner that the ratio (N/COOH) of the number of nitrogen atoms in the base (C-2) to the number of carboxy groups in the crosslinking agent (B) reached 1.5.

Next, a 3APTES aqueous solution, a mixed solution of 135BTC and ammonia, and water were mixed in such a manner to have the concentration shown in Table 2 to prepare a composition.

Examples 2 to 5, 7, 8, and 14 to 16

In a similar manner to Example 1, a composition was prepared in such a manner to have the composition and concentration shown in Table 2.

Here, 3-aminopropyldiethoxymethylsilane (3APDES) of the compound (A) in Examples 7 and 8 was dissolved in water to prepare a 50% by mass aqueous solution, and after standing overnight, it was confirmed that the alkoxysilane was hydrolyzed by proton NMR spectrum, and this was used for preparation of a composition. The weight average molecular weight (Mw) after hydrolysis was 230.

3-aminopropyltrimethoxysilane (3APTS) of the compound (A) in Examples 14 to 16 was dissolved in water to prepare a 50% by weight aqueous solution, and after standing overnight, it was confirmed that the alkoxysilane was hydrolyzed by the proton NMR spectrum, and this was used for preparation of a composition.

Example 6

3-aminopropyldiethoxymethylsilane (3APDES) as the compound (A) was dissolved in water to prepare a 50% by weight aqueous solution, and after standing overnight, it was confirmed that the alkoxysilane was hydrolyzed by the proton NMR spectrum, and this was used for preparation of a composition. The weight average molecular weight (Mw) after hydrolysis was 230.

After mixing a formic acid (FA) aqueous solution (4.4% by mass) with the obtained 3APDES solution in such a manner that the ratio (COOH/N) of the number of carboxy groups in the acid (C-1) to the total number of nitrogen atoms in the compound (A) reached 0.92, a 3APDES solution was mixed with an ethanol solution of PMA as the crosslinking agent (B) and water in such a manner to have the concentration shown in Table 2 to prepare a composition.

Example 9

4 g of 3-aminopropyldiethoxymethylsilane (3APDES) as the compound (A) was added to 56 g of 1-propanol (1PrOH), and 20 g of formic acid (FA) aqueous solution (8.8% by mass) was added dropwise. After stirring at room temperature for one hour, the mixture was stirred in a water bath at 60° C. for one hour to obtain a 3APDES solution.

1-propanol half ester 1,2,4-benzene tricarboxylic acid (1Prhe124BTC; 1-propanol half ester 124BTC) as the crosslinking agent (B) used was one obtained by dissolving trimellitic anhydride in 1-propanol (1PrOH) and confirming formation of an ester group by proton NMR.

A composition was prepared by mixing 1Prhe124BTC solution with the obtained 3APDES solution and further mixing water and 1-propanol in such a manner to have the concentrations shown in Table 2.

Example 10

In a similar manner to Example 9, a composition was prepared in such a manner to have the composition and concentration shown in Table 2.

Example 11

3-aminopropyldiethoxymethylsilane (3APDES) as the compound (A) was dissolved in water to prepare a 50% by weight aqueous solution, and then allowed to stand overnight to prepare a composition. The weight average molecular weight (Mw) after hydrolysis was 230.

A solution of Ethyl half ester oxy diphthalic acid (eheOPDA; ethylhalf ester oxydiphthalic acid) as the crosslinking agent (B) was obtained by dissolving 4,4'-oxydiphthalic anhydride in ethanol.

The obtained 3APDES aqueous solution, eheOPDA solution, water, ethanol (EtOH), and 1-propanol were mixed in such a manner to have the concentrations shown in Table 2 to prepare a composition.

Example 12

3-aminopropyldiethoxymethylsilane (3APDES) of the compound (A) was dissolved in water to make a 50% by mass aqueous solution, and then allowed to stand overnight to prepare a composition. The weight average molecular weight (Mw) after hydrolysis was 230.

An ethanol solution of ethyl half ester pyromellitic acid (ehePMA; ethyl half ester PMA) as the crosslinking agent (B) was prepared.

An ethanol solution of 1,2,4,5-cyclohexanetetracarboxylylethyl half ester (eheHPMA 1,2,4,5-Cyclohexanetetracarboxylic ethyl half ester) as the crosslinking agent (B) was prepared.

The obtained 3APDES aqueous solution, ehePMA solution, eheHPHA solution, water, ethanol (EtOH), and 1-propanol were mixed in such a manner to have the concentrations shown in Table 2 to prepare a composition.

Example 13

N-METHYLAMINOPROPYLMETHYLDIMETHOXYSILANE (N-MAPDS) as the compound (A) was dissolved in water to prepare a 50% by mass aqueous solution, and the solution was then allowed to stand overnight to prepare a composition.

The eheOPDA solution as the crosslinking agent (B) was obtained by dissolving oxydiphthalic anhydride in ethanol.

The obtained N-MAPDS aqueous solution, eheOPDA solution, water, ethanol (EtOH), and 1-propanol were mixed in such a manner to have the concentrations shown in Table 2 to prepare a composition.

Example 17

<Branched Polyethyleneimine 2>

Polyethyleneimine (Mw=70,000, primary nitrogen atom/secondary nitrogen atom/tertiary nitrogen atom=31/40/29) manufactured by BASF was used as branched polyethyleneimine 2 (BPEI_2).

For the solution obtained by dissolving polymer sample in heavy water, from the result of measuring $^{13}$C-NMR at 80° C. by a decoupling method with single pulse inverse gate method in an AVANCE 500 type nuclear magnetic resonance apparatus, manufactured by Bruker Corporation, to which amine (nitrogen atom) each carbon atom was bonded was analyzed, and the amount of primary nitrogen atom (mol %), the amount of secondary nitrogen atom (mol %) and the amount of tertiary nitrogen atom (mol %) were calculated based on the integrated value of the result. Attributions are described in European Polymer Journal, 1973, Vol. 9, pp. 559 and the like.

The weight-average molecular weight was measured using an analyzer Shodex GPC-101 and using a column Asahipak GF-7M HQ, and was calculated using polyethylene glycol as the reference standard. An aqueous solution having an acetic acid concentration of 0.5 mol/L and a sodium nitrate concentration of 0.1 mol/L was used as a developing solvent.

Here, the amount (mol %) of the primary nitrogen atom, the amount (mol %) of the secondary nitrogen atom, and the amount (mol %) of the tertiary nitrogen atom are respectively expressed by the following Formulae A to C.

Amount of primary nitrogen atom (mol %)=(mol number of primary nitrogen atom/(mol number of primary nitrogen atom+mol number of secondary nitrogen atom+mol number of tertiary nitrogen atom))×100    Formula A Amount of secondary nitrogen atom (mol %)=(mol number of secondary nitrogen atom/(mol number of primary nitrogen atom+mol number of secondary nitrogen atom+mol number of tertiary nitrogen atom))×100    Formula B Amount of tertiary nitrogen atom (mol %)=(mol number of tertiary nitrogen atom/(mol number of primary nitrogen atom+mol number of secondary nitrogen atom+mol number of tertiary nitrogen atom))×100    Formula C 3-aminopropyltrimethoxysilane (3APTS; (3-Aminopropyl) trimethoxysilane) as the compound (A) was dissolved in water to prepare a 50% by weight aqueous solution, and after standing overnight, it was confirmed that the alkoxysilane was hydrolyzed by the proton NMR spectrum, and this was used for preparation of a composition.

Ammonia as the base (C-2) and water were mixed with 135BTC as the crosslinking agent (B) to prepare a mixed solution of 135BTC (14% by mass) and ammonia. Ammonia was added in such a manner that the ratio (N/COOH) of the number of nitrogen atoms in the base (C-2) to the number of carboxy groups in the crosslinking agent (B) reached 1.5.

An aqueous solution of branched polyethyleneimine 2 (BPEI_2) was prepared.

A 3APTS aqueous solution, a mixed solution of 135BTC and ammonia, a BPEI_2 aqueous solution, and water were mixed in such a manner to have the concentration shown in Table 2 to prepare a composition.

Comparative Example 1

3-aminopropyltriethoxysilane (3APTES) as the compound (A) was dissolved in water to prepare a 50% by weight aqueous solution, and after standing overnight, it was confirmed that the alkoxysilane was hydrolyzed by the proton NMR spectrum, and this was used for preparation of a composition. Next, a 3APTES aqueous solution was prepared in such a manner to have the concentration shown in Table 2.

Comparative Example 2

3-aminopropyltriethoxysilane (3APTES) as the compound (A) was dissolved in water to prepare a 50% by mass aqueous solution, and then allowed to stand overnight to prepare a composition.

The obtained 3APTES (50% by mass) aqueous solution, a tripropyl-1,2,4-benzenetricarboxylic acid (TrPr124BTC; tripropyl-124BTC) 1-propanol solution containing no carboxy group and containing three ester bonds, and 1-propanol were mixed in such a manner to have the concentration shown in Table 2 to prepare a composition.

Comparative Example 3

In a similar manner to Comparative Example 1, a 3APDES aqueous solution was prepared to have the composition and concentration shown in Table 2.

TABLE 2

| | Compound (A) | | Amine other than compound (A) | | Crosslinking agent (B) or COOX-containing compound other than crosslinking agent (B) Type | Acid (C-1) or base (C-2) | Solvent other than water | pH |
|---|---|---|---|---|---|---|---|---|
| | Type | Concentration in composition (% by mass) | Type | Concentration in composition (% by mass) | | | | |
| Comparative Example 1 | 3APTES | 3 | | | | | | |
| Example 1 | 3APTES | 3 | | | 135BTC [1.0] | NH3 <1.5> | | |
| Example 2 | 3APTES | 3 | | | 124BTC [1.5] | NH3 <1.5> | | |
| Example 3 | 3APTES | 3 | | | PMA [2.0] | NH3 <1.5> | | |
| Example 4 | 3APTES | 0.15 | | | PMA [2.0] | NH3 <1.5> | | |
| Example 5 | 3APTES | 10 | | | PMA [2.0] | NH3 <1.5> | | |
| Comparative Example 2 | 3APTES | 3 | | | TrPr124BTC [1.5] | | 1PrOH (91% by mass) | |
| Comparative Example 3 | 3APDES | 3 | | | | | 1PrOH (94% by mass) | |
| Example 6 | 3APDES | 5 | | | PMA [2.0] | FA {0.92} | EtOH (17% by mass) | |
| Example 7 | 3APDES | 3 | | | PMA [2.0] | NH3 <1.5> | | |
| Example 8 | 3APDES | 10 | | | PMA [2.0] | NH3 <1.5> | | |
| Example 9 | 3APDES | 4 | | | 1Prhe124BTC [1.15] | FA {1.83} | 1PrOH (88% by mass) | |
| Example 10 | 3APDES | 3.4 | | | ehePMA [0.7] | FA {1.83} | 1PrOH (49% by mass) + EtOH (28% by mass) | |

TABLE 2-continued

| | Compound (A) | | Amine other than compound (A) | | Crosslinking agent (B) or COOX-containing compound other than crosslinking agent (B) Type | Acid (C-1) or base (C-2) | Solvent other than water | pH |
|---|---|---|---|---|---|---|---|---|
| | Type | Concentration in composition (% by mass) | Type | Concentration in composition (% by mass) | | | | |
| Example 11 | 3APDES | 1.5 | | | eheOPDA [1.0] | | 1PrOH (33% by mass) + EtOH (29% by mass) | |
| Example 12 | 3APDES | 2.5 | | | ehePMA [0.5] + eheHPMA [0.5] | | 1PrOH (68% by mass) + EtOH (23% by mass) | |
| Example 13 | N-MAPDS | 3 | | | eheOPDA [1.0] | | 1PrOH (52% by mass) + EtOH (28% by mass) | |
| Example 14 | 3APTS | 3 | | | 135BTC [1.0] | NH3 <1.5> | | 9.92 |
| Example 15 | 3APTS | 3 | | | 124BTC [1.5] | NH3 <1.5> | | 9.97 |
| Example 16 | 3APTS | 3 | | | PMA [2.0] | NH3 <1.5> | | 10.3 |
| Example 17 | 3APTS | 1 | BPEI_2 | 1 | 135BTC [0.86] | NH3 <1.5> | | 9.76 |

<Formation of Film>

A silicon substrate was prepared as a substrate to which a composition (hereinafter also referred to as "composition") was applied. A silicon substrate was placed on the spin coater, 1.0 mL of the composition prepared in each Example and each Comparative Example was dropped at a constant speed for 10 seconds, held for 13 seconds, then rotated at 2,000 rpm (rpm is rotational speed) for 1 second, at 600 rpm for 30 seconds, then rotated at 2,000 rpm for 10 seconds to dry. By this, a film was formed on the silicon substrate.

Next, after drying at 125° C. for 1 minute, the film was heated at 300° C. for 10 minutes in a nitrogen atmosphere (30 kPa). For evaluation of heat resistance, the film was further heated at 350° C., 380° C., and 400° C. for 10 minutes (the same sample was continuously processed).

<Measurement of Refractive Index>

After heating at 400° C., the refractive index of the film formed on the silicon substrate was measured. The refractive index was measured using an ellipsometer. The film thickness was calculated from the measured optical data. When the film thickness was 10 nm or more, fitting was performed with an optical model of air/(Cauchy+Lorenz oscillator model)/natural oxide film/silicon substrate. When the film thickness was less than 10 nm, fitting was performed using an optical model of air/(Cauchy+Lorenz oscillator model)/natural oxide film/silicon substrate using a Cauchy+Lorenz oscillator model using complex index of refraction of material of the same composition having a film thickness of 10 nm or more. Since the film thickness is obtained by calculation, the result can be negative.

In Table 3, N633 represents the refractive index at a wavelength of 633 nm.

The results are shown in Table 3.

<Heat Resistance Evaluation>

The heat resistance of the film was evaluated based on the film thickness residual rate calculated from the film thickness after heating at 300° C. for 10 minutes and the film thickness after heating at 380° C. for 10 minutes. The Formula of the film thickness residual rate is as described below, and one having a film thickness residual rate of 70% or more was determined to be "heat resistant".

film thickness residual rate (%)=(film thickness after heating at 380° C./film thickness after heating at 300° C.)×100

The results are shown in Table 3.

<Crosslinked Structure>

The crosslinked structure of a film was measured by Fourier transform infrared spectroscopy (FT-IR). Analyzers used are as follows.

—FT-IR Analyzer—

Infrared absorption analyzer (DIGILAB EXCALIBUR (manufactured by Digilab, Inc.))

—Measurement Condition—

IR source: air-cooled ceramic, beam splitter: wide range KBr, detector: Peltier cooling DTGS, measurement wavenumber range: 7,500 $cm^{-1}$ to 400 $cm^{-1}$, resolution: 4 $cm^{-1}$, integration times: 256, background: Si bare wafer used, measurement atmosphere: $N_2$ (10 L/min), IR (infrared) incident angle: 72° (=Brewster angle of Si)

—Determination Conditions—

The imide bond was determined by the presence of a vibration peak at 1,770 $cm^{-1}$ and 1,720 $cm^{-1}$. The amide bond was determined by the presence of a vibration peak at 1,650 $cm^{-1}$, 1,520 $cm^{-1}$.

The results are shown in Table 3.

<SEM Morphology Observation>

For a film having a film thickness of from 20 nm to 150 nm, the smoothness of the film was evaluated by morphology observation by SEM. Measurement was carried out with an accelerating voltage of 3 kV, 200,000 times, 500 nm width field of view using a scanning electron microscope (SEM) S-5,000 (manufactured by Hitachi, Ltd.). When the difference between the maximum film thickness and the minimum film thickness was not more than 25% of the average film thickness, it was determined to be "smooth".

The results are shown in Table 3. After heating at 400° C. for 10 minutes, the film was subjected to SEM morphology observation.

<SPM Morphology Observation>

For a film having a film thickness of less than 20 nm, the unevenness of the film was evaluated by morphology observation by SPM. Measurement was carried out in a 3 micron×3 micron square area in a dynamic force microscope mode using a scanning probe microscope (SPM) SPA-400

(manufactured by Hitachi High-Technologies Corporation). When the root mean square surface roughness measured by SPM was 25% or less with respect to the film thickness measured with an ellipsometer, it was determined to be "smooth".

The results are shown in Table 3. After heating at 400° C. for 10 minutes, the film was subjected to SPM morphology observation.

The measurement results and the evaluation results of the physical properties of films formed using the composition according to the Examples and Comparative Examples are shown in Table 3. The blank column in Table 3 represents unconfirmed (crosslinked structure) or not performed (SEM morphology observation and SPM morphology observation).

TABLE 3

| | Film thickness after drying at 125° C. (nm) | Film thickness after heating at 300° C. (nm) | Film thickness after heating at 350° C. (nm) | Film thickness after heating at 380° C. (nm) | Film thickness after heating at 400° C. (nm) | Film thickness after heating at 400° C./ N633 | Film thickness residual rate (%) | Cross-linked structure | SEM morphology observation | SPM morphology observation |
|---|---|---|---|---|---|---|---|---|---|---|
| Comparative Example 1 | 41.1 | 41.1 | 38.2 | 27.1 | 21.4 | 1.41 | 65.94 | None | | 400° C. heated film with smoothness |
| Example 1 | 60.2 | 52.1 | 46.0 | 44.9 | 44.2 | 1.55 | 86.18 | Amide | 400° C. heated film with smoothness | |
| Example 2 | 70.3 | 55.1 | 54.6 | 53.8 | 52.5 | 1.57 | 97.64 | Imide amide | 400° C. heated film with smoothness | |
| Example 3 | 72.1 | 62.7 | 59.8 | 60.2 | 59.1 | 1.56 | 96.01 | Imide | 400° C. heated film with smoothness | |
| Example 4 | 3.3 | 2.9 | 3.0 | 2.9 | 2.8 | 1.56 | 100.00 | | | 400° C. heated film with smoothness |
| Example 5 | 365.3 | 287.8 | 286.0 | 281.6 | 278.9 | 1.57 | 97.85 | | | |
| Comparative Example 2 | Not mirror surface | | | | | | | | | |
| Comparative Example 3 | Many minute pinholes | | | | | | | None | | |
| Example 6 | 194.1 | 144.3 | 142.3 | 140.2 | 139.8 | 1.58 | 97.16 | | | |
| Example 7 | 98.2 | 83.9 | 83.3 | 84.3 | 83.1 | 1.54 | 100.48 | Imide | 400° C. heated film with smoothness | |
| Example 8 | 416.8 | 366.1 | 368.0 | 365.9 | 362.7 | 1.54 | 99.95 | | | |
| Example 9 | 286 | 218.3 | 217.5 | | 209.6 | 1.55 | | Amide imide | 400° C. heated film with smoothness | |
| Example 10 | 208.2 | 143.9 | 139.7 | | 136.5 | 1.55 | | Imide | 400° C. heated film with smoothness | |
| Example 11 | | | | | 88.1 | 1.55 | | Imide | 400° C. heated film with smoothness | |
| Example 12 | 150.1 | 101.2 | 100.2 | 96.7 | 94.3 | 1.52 | 95.55 | | | |
| Example 13 | 359 | 275.8 | 253 | 231.9 | 211.1 | 1.53 | 84.08 | | 400° C. heated film with smoothness | |
| Example 14 | 76.6 | 65.0 | 63.8 | 62.2 | 61.1 | 1.55 | 95.69 | amide | 400° C. heated film with smoothness | |
| Example 15 | 87.7 | 74.7 | 73.9 | 72.9 | 70.8 | 1.58 | 97.59 | Amide imide | | |
| Example 16 | 93.1 | 76.7 | 76.6 | 76.1 | 75.6 | 1.56 | 99.22 | Imide | | |
| Example 17 | 93.4 | 71.7 | 60.5 | 57.9 | 57.3 | 1.51 | 80.75 | | | |

As shown in Table 3, in each of Examples 1 to 8 and 12 to 17, the film thickness residual rate was 70% or more, while the film thickness residual rate in Comparative Example 1 was less than 66%. From this, it is assumed that a film formed from the composition in each Example is excellent in heat resistance.

In Example 12, since 3APDES which was a compound having a primary amino group was used as the crosslinking agent (B), the film thickness residual rate was higher than that of Example 13 using N-MAPDS which was a compound containing a secondary amine. From this, it is presumed that a film formed from a composition using a compound containing a primary amino group as the crosslinking agent (B) is more excellent in heat resistance.

In Examples 1 to 3, 7, 9 to 11, 13, and 14, as a result of SEM morphology observation, the film was smooth.

In Comparative Examples 2 and 3, the film surface did not become a mirror surface, or there were many minute pinholes and the surface was not smooth.

In Example 4, as a result of SPM morphology observation, the film was smooth.

<In-Plane Film Thickness Distribution of Silicon Substrate>

Example 18

In a similar manner to Example 9, a 3APDES solution, 1Prhe124BTC solution, water, and 1-propanol were mixed to prepare a composition (Solution 1).

In Solution 1, the concentration of the compound (A) in the composition was 2% by mass, the ratio (COOH/N) of the number of carboxy groups in the crosslinking agent (B) to the total number of nitrogen atoms in the compound (A) was 1.0, the ratio (COOH/N) of the number of carboxy groups in the acid (C-1) to the total number of nitrogen atoms in the compound (A) was 1.83, and the concentration of 1-propanol in the composition was 91% by mass.

Then, after dropping 6 mL of coating liquid on a 300 mmφ silicon substrate, the silicon substrate was rotated at 1,000 rpm for 1 second, at 600 rpm for 60 seconds, and at 1,000 rpm for 5 seconds, then dried at 100° C. for 2 minutes, heated at 250° C. for 1 minute, and further heat treated at 400° C. for 10 minutes at atmospheric pressure in nitrogen. A film was thus formed on the silicon substrate.

Example 19

In a similar manner to Example 9, a 3APDES solution, 1Prhe124BTC solution, water, and 1-propanol were mixed to prepare a composition (Solution 2).

In Solution 2, the concentration of the compound (A) in the composition was 0.2% by mass, the ratio (COOH/N) of the number of carboxy groups in the crosslinking agent (B) to the total number of nitrogen atoms in the compound (A) was 1.0, the ratio (COOH/N) of the number of carboxy groups in the acid (C-1) to the total number of nitrogen atoms in the compound (A) was 1.83, and the concentration of 1-propanol in the composition was 99.1% by mass.

Then, in a similar manner to Example 18, a film was formed on the silicon substrate.

Example 20

3-aminopropyldiethoxymethylsilane (3APDES) as the compound (A) was dissolved in water to prepare a 50% by weight aqueous solution, and then allowed to stand overnight to prepare a composition. The weight average molecular weight (Mw) after hydrolysis was 230.

A solution of Ethyl half ester oxy diphthalic acid (eheOPDA; ethylhalf ester oxydiphthalic acid) as the crosslinking agent (B) was obtained by dissolving 4,4'-oxydiphthalic anhydride in ethanol.

The obtained 3APDES aqueous solution, eheOPDA solution, water, ethanol (EtOH), and 1-propanol were mixed in such a manner to have the concentrations shown in Table 4 to prepare a composition (solution 3).

By using the obtained composition (solution 3), a film was formed on the silicon substrate in a similar manner to Example 18.

Film thicknesses at 1 cm, 5 cm, 9 cm, and 13 cm from the center of a 300 mmφ silicon substrate, and the difference (%) between film thicknesses at 1 cm and 13 cm from the center were determined, and the in-plane film thickness distribution of the silicon substrate was evaluated.

The results are shown in Table 4.

In Table 4, the concentration in parentheses in 3APDES (2% by mass), 3APDES (0.2% by mass), and 3APDES (1.8% by mass) represents the concentration of 3APDES in the composition.

Numerical values in parentheses in 1Prhe124BTC [1.0], eheOPDA [1.0] represent the ratio (COOH/N) of the number of carboxy groups in 1Prhe124BTC or eheOPDA as the crosslinking agent (B) to the total number of nitrogen atoms in 3APDES as the compound (A).

1.83 in the parentheses of FA represents the ratio (COOH/N) of the number of carboxy groups in FA as the acid (C-1) to the total number of nitrogen atoms in 3APDES as the compound (A).

The concentration in parentheses in 1PrOH (91% by mass), 1PrOH (99.1% by mass), 1PrOH (33% by mass), and EtOH (29% by mass) represents the concentrations of 1PrOH and EtOH in the composition.

"Difference between film thicknesses at 1 cm and 13 cm from center (%)" was calculated by multiplying "((film thickness at 1 cm from center)−(film thickness at 13 cm from center))/((film thickness at 1 cm from center)+(film thickness at 5 cm from center)+(film thickness at 9 cm from center)+(film thickness at 13 cm from center))/4)" by 100.

TABLE 4

| | Solution center (nm) | Film thickness at 1 cm from center (nm) | Film thickness at 5 cm from center (nm) | Film thickness at 9 cm from center (nm) | Film thickness at 13 cm from center (nm) | Difference between film thicknesses at 1 cm and 13 cm from center (%) |
|---|---|---|---|---|---|---|
| Example 18 | Solution 1: 3APDES (2% by mass) + 1Prhe124BTC [1.0] + FA {1.83} + 1PrOH (91% by mass) | 95.2 | 92.9 | 87.0 | 93.0 | 2.4 |
| Example 19 | Solution 2: 3APDES (0.2% by mass) + 1Prhe124BTC [1.0] + FA {1.83} + 1PrOH (99.1% by mass) | 8.0 | 7.7 | 7.1 | 7.5 | 6.6 |
| Example 20 | Solution 3: 3APDES (1.8% by mass) + eheOPDA [1.0] + 1PrOH (33% by mass) + EtOH (29% by mass) | 115.4 | 113.1 | 110.6 | 113.4 | 1.8 |

As shown in Table 4, the difference between film thicknesses at 1 cm and 13 cm from center was 15% or less in Examples, which was a small value. Therefore, it was found that a smooth film excellent in in-plane uniformity can be obtained in a simpler process in a 300 mmφ silicon wafer by using the composition according to Examples 18 to 20.

<Filling Property in Trench>

Example 21

A BPEI_2 aqueous solution and an aqueous solution of 3-aminopropyltriethoxysilane (3APTES; (3-Aminopropyl)triethoxysilane) were mixed, and ammonia (NH3) as the base (C-2) was mixed with 135BTC in such a manner that N/COOH (the ratio of the number of nitrogen atoms in ammonia to the number of carboxy groups in 135BTC) reached 1.5. Here, as the 3APTES, a 50% aqueous solution left to stand overnight was used.

135BTC was then mixed with a mixed solution of BPEI_2 and 3APTES in such a manner that COOH/N (the ratio of the number of carboxy groups in 135BTC to the number of nitrogen atoms in BPEI_2 and 3APTES) reached 0.9 to prepare a composition (Solution 4).

Example 22

A composition (Solution 5) prepared in Example 2 was prepared.

Example 23

A composition (Solution 1) prepared in Example 18 was prepared.

Example 24

A composition (Solution 3) prepared in Example 20 was prepared.

Example 25

A mixed solution of 3-aminopropyldiethoxymethylsilane (3APDES) and 3-aminopropyldimethylethoxysilane (3APDMS) as the compound (A) was prepared by dissolving 18.75 g of 3APDES and 6.25 g of 3APDMS in 25 g of water and allowing to stand overnight.

A composition (solution 6) was prepared by mixing an ethanol solution of eheOPDA as the crosslinking agent (B), 1-propanol, ethanol, and water to the mixed solution in such a manner to have the concentration shown in Table 5.

Example 26

A mixed solution of 3-aminopropyldiethoxymethylsilane (3APDES) as the compound (A) and para-xylenediamine (pXDA) was prepared by adding 3APDES to water to prepare a 50% aqueous solution and then allowing to stand overnight, and mixing with 1-propanol solution of pXDA.

A composition (solution 7) was prepared by mixing an ethanol solution of eheOPDA as the crosslinking agent (B), ethanol, and water to the mixed solution in such a manner to have the concentration shown in Table 5.

Example 27

2.0 g of 3APDES was added to 26.15 g of 1-propanol, 10 g of formic acid (FA) aqueous solution (8.8% by mass) was added dropwise thereto, and 1.85 g of BTESE was added thereto, and the mixture was stirred for one hour at room temperature, and then heated in a 60° C. water bath for one hour to prepare a mixed solution of 3-aminopropyldiethoxymethylsilane (3APDES) as the compound (A) and bistriethoxysilylethane (BTESE) (presumed to contain a siloxane polymer of 3APDES and BTESE).

To the mixed solution, a 1-propanol solution of 1Prhe124BTC as the crosslinking agent (B), and water were mixed in such a manner to have the composition shown in Table 5 to prepare a composition (solution 8).

Example 28

2.0 g of 3APDES was added to 28.6 g of 1-propanol, 10 g of formic acid (FA) aqueous solution (8.8% by mass) was added dropwise thereto, and 1.4 g of HETSC was added thereto, and the mixture was stirred for one hour at room temperature, and then heated in a 60° C. water bath for one hour to prepare a mixed solution of 3-aminopropyldiethoxymethylsilane (3APDES) as the compound (A) and 1,1,3,3,5,5-hexaethoxy-1,3,5-trisilacyclohexane (HETSC) (presumed to contain a siloxane polymer of 3APDES and HETSC).

To the mixed solution, a 1-propanol solution of 1Prhe124BTC as the crosslinking agent (B), and water were mixed in such a manner to have the composition shown in Table 5 to prepare a composition (solution 9).

Example 29

A 1-propanol solution of 1,3-bis (3-aminopropyl)-tetramethyldisiloxane (BATDS; 1,3-bis(3-aminopropyl)-tetramethyldisiloxane) as the compound (A), an ethanol solution of eheOPDA as the crosslinking agent (B), 1-propanol, and ethanol were mixed in such a manner to have the composition shown in Table 5 to prepare a composition (solution 10).

In Table 5, the concentration in parentheses in each of BPEI_2 (1.7% by mass), 3APTES (3.3% by mass), 3APTES (3% by mass), 3APDES (2% by mass), 3APDES (1.8% by mass), 3APDES (4% by mass), 3APDMS (0.6% by mass), pXDA (5% by mass), BTESE (3.7% by mass), HETSC (2.8% by mass) and BATDS (2% by mass) represents the concentration of each of BPEI_2, 3APTES, 3APDES, 3APDMS, pXDA, BTESE, HETSC, and BATDS.

A numerical value in parentheses in each of 135BTC [0.9], 124BTC [1.5], 1Prhe124BTC [1.0], 1Prhe124BTC [1.15], and eheOPDA [1.0] represents the ratio (COOH/N) of the number of carboxy groups in 135BTC, 124BTC, 1Prhe124BTC, or eheOPDA to the total number of nitrogen atoms in the compound (A).

1.83 in the parentheses of FA represents the ratio (COOH/N) of the number of carboxy groups in FA to the total number of nitrogen atoms in the compound (A).

The numerical value in parentheses of NH3 <1.5> represents the ratio (N/COOH) of the number of nitrogen atoms in NH3 to the number of carboxy groups in the crosslinking agent (B).

The concentration in parentheses in each of 1PrOH (91% by mass), 1PrOH (33% by mass), 1PrOH (28% by mass), 1PrOH (2% by mass), 1PrOH (69% by mass), 1PrOH (37% by mass), EtOH (29% by mass), EtOH (43% by mass), EtOH (36% by mass), and EtOH (59% by mass) represents the concentration of 1PrOH or EtOH in the composition.

Next, 0.5 mL of the composition was added dropwise at a constant rate for 10 seconds on a silicon oxide substrate provided with a trench pattern of 100 nm width and 200 nm depth, and after being held for 13 seconds, the silicon oxide substrate was rotated at 2,000 rpm for one second and 600 rpm for 30 seconds, and then rotated at 2,000 rpm for 10 seconds to dry. Next, the composition added dropwise was dried at 100° C. for 1 minute, then heated at 300° C. for 1 minute, and further heat treated at 400° C. for 10 minutes.

Whether the composition was filled in the trench with a cross sectional SEM was observed. A case in which the filled area was 90% or more of the area inside the trench was taken as A (favorable filling property).

The results are shown in Table 5.

Similarly, 0.5 mL of the composition was added dropwise at a constant rate for 10 seconds on a silicon oxide substrate provided with a trench pattern of 50 nm width and 200 nm depth, and after being held for 13 seconds, the silicon oxide substrate was rotated at 2,000 rpm for one second and 600 rpm for 30 seconds, and then rotated at 2,000 rpm for 10 seconds to dry. Next, the composition added dropwise was dried at 100° C. for 1 minute, then heated at 300° C. for 1 minute, and further heat treated at 400° C. for 10 minutes.

Whether the composition was filled in the trench with a cross sectional SEM was observed. A case in which the filled area was 90% or more of the area inside the trench was taken as A (favorable filling property), and a case in which the filled area was less than 90% of the area inside the trench was taken as B.

The results are shown in Table 5.

property. In Example 24, in the semiconductor film composition containing 3APDES and eheOPDA, more than 10% voids were generated.

From this, it is presumed that the film having an amide imide bond (Example 23) was more excellent in filling property than the film having an imide bond (Example 24). From Example 24 and Example 26, it is presumed that a film formed from a solution containing pXDA which was an amine having a ring structure (Example 26) had more excellent filling property.

<Relative Dielectric Constant and Leakage Current Density>

Comparative Example 4

Acetic acid (AA) as acid (C-1) was added to BPEI_2 aqueous solution in such a manner that COOH/N (ratio of the number of carboxy groups in acetic acid to the number of nitrogen atoms in BPEI_2) reached 0.14. Next, 135BTC was mixed in a BPEI_2 aqueous solution in such a manner that COOH/N (the ratio of the number of carboxy groups in 135BTC to the number of nitrogen atoms in BPEI_2) reached 0.67, and ethanol was mixed in such a manner to adjust the concentration of ethanol (EtOH) to the total composition to 33 mass %, to prepare a composition (solution 11).

TABLE 5

| | Sample | Filling property 100 nm width | Filling property 50 nm width |
|---|---|---|---|
| Example 21 | Solution 4: 3APTES (3.3% by mass) + BPEI_2 aqueous solution (1.7% by mass) + 135BTC [0.9] + NH3 <1.5> | A | |
| Example 22 | Solution 5: 3APTES (3% by mass) + 124BTC [1.5] + NH3 <1.5> | A | |
| Example 23 | Solution 1: 3APDES (2% by mass) + 1Prhe124BTC [1.0] + FA {1.83} + 1PrOH (91% by mass) | A | A |
| Example 24 | Solution 3: 3APDES (1.8% by mass) + eheOPDA [1.0] + 1PrOH (33% by mass) + EtOH (29% by mass) | A | B |
| Example 25 | Solution 6: 3APDES (1.8% by mass) + 3APDMS (0.6% by mass) + eheOPDA [1.0] + 1PrOH (28% by mass) + EtOH (43% by mass) | A | A |
| Example 26 | Solution 7: 3APDES (2% by mass) + pXDA (5% by mass) + eheOPDA [1.0] + 1PrOH (2% by mass) + EtOH (36% by mass) | A | A |
| Example 27 | Solution 8: 3APDES (4% by mass) + BTESE (3.7% by mass) + FA {1.83} + 1Prhe124BTC [1.15] + 1PrOH (69% by mass) | A | |
| Example 28 | Solution 9: 3APDES (4% by mass) + HETSC (2.8% by mass) + FA {1.83} + 1Prhe124BTC [1.0] + 1PrOH (69% by mass) | A | |
| Example 29 | Solution 10: BATDS (2% by mass) + eheOPDA [1.0] + 1PrOH (37% by mass) + EtOH (59% by mass) | A (Excellent in surface flatness) | |

As shown in Table 5, the filling property was favorable with the 100 nm width trench. Therefore, it was found that by using the compositions according to Examples 21 to 29, it was possible to obtain a film excellent in filling property with a 100 nm width trench.

From the results of Examples 23, 25, and 26, in the case of a 50 nm width trench, the composition including 3APDES and 1Prhe124BTC, the composition including 3APDES, 3APDMS, and eheOPDA, the composition including 3APDES, pXDA, and eheOPDA had excellent embedding Example 30

3-aminopropylmethyldiethoxysilane (3APDES) as the compound (A) was dissolved in water to prepare a 50% by mass aqueous solution, and then allowed to stand overnight to prepare a composition. The weight average molecular weight (Mw) after hydrolysis was 230.

Ammonia as the base (C-2) and water were mixed with 135BTC as the crosslinking agent (B) to prepare a mixed solution of 135BTC (14% by mass) and ammonia. Ammonia was added in such a manner that the ratio (N/COOH) of the number of nitrogen atoms in the base (C-2) to the number of carboxy groups in the crosslinking agent (B) was 1.5.

A mixed solution of 135BTC and ammonia, water, and ethanol were mixed in a 3APDES aqueous solution in such a manner to have the concentration shown in Table 6 to prepare a composition (solution 12).

Example 31

A composition (Solution 1) prepared in Example 18 was prepared.

Example 32

A composition (Solution 2) prepared in Example 19 was prepared.

Example 33

A composition (Solution 3) prepared in Example 20 was prepared.

After 5 mL of solutions 1 to 3, 11, and 12 were respectively added dropwise on a low resistance silicon substrate, the low resistance silicon substrate was rotated at 1,000 rpm for 5 seconds and 500 rpm for 30 seconds. Next, the composition added dropwise was dried at 100° C. for 1 minute, then heated at 250° C. for 1 minute, and further heat treated at 400° C. for 10 minutes. As a result, a layered body including a low resistance silicon substrate/film was obtained.

(Measurement of Relative Dielectric Constant)

The relative dielectric constant of the film in the obtained layered body was measured.

The relative dielectric constant was measured by an ordinary method at a frequency of 100 kHz in an atmosphere of 25° C. and 30% relative humidity using a mercury probe device (SSM5130).

The results are shown in Table 6.

(Measure of Leakage Current Density)

Next, in order to evaluate the electric characteristics, leakage current density was measured as follows. Specifically, a mercury probe was placed on the film surface of the obtained layered body, and measured values at electric field strengths of 1 MV/cm and 2 MV/cm were taken as the leakage current densities.

The results are shown in Table 6.

The composition, relative dielectric constant, and leakage current density of the samples in Comparative Example 4 and Examples 30 to 33 are shown in Table 6.

In Table 6, the concentration in parentheses in each of BPEI_2 aqueous solution (1.8% by mass), 3APDES (3% by mass), 3APDES (2% by mass), 3APDES (0.2% by mass), and 3APDES (1.8% by mass) represents the concentration of BPEI_2 or 3APDES in the composition.

A numerical value in parentheses in each of 135BTC [0.67], 135BTC [1.0], 1Prhe124BTC [1.0], and eheOPDA [1.0] represents the ratio (COOH/N) of the number of carboxy groups in 135BTC, 1Prhe124BTC, or eheOPDA to the total number of nitrogen atoms in the compound (A).

A numerical value in parentheses of AA or FA, 0.14 or 1.83, represents the ratio (COOH/N) of the number of carboxy groups in AA or FA to the total number of nitrogen atoms in compound (A).

The numerical value in parentheses of NH3 <1.5> represents the ratio (N/COOH) of the number of nitrogen atoms in NH3 to the number of carboxy groups in the crosslinking agent (B).

The concentration in parentheses in each of 1PrOH (91% by mass), 1PrOH (99.1% by mass), 1PrOH (33% by mass), EtOH (33% by mass), EtOH (30% by mass), and EtOH (29% by mass) represents the concentration of 1PrOH or EtOH in the composition.

TABLE 6

| | Sample | Relative dielectric constant | Leakage current density (A/cm2) *Electric field strength 1 MV/cm | Leakage current density (A/cm2) *Electric field strength 2 MV/cm | Film thickness (nm) |
|---|---|---|---|---|---|
| Comparative Example 4 | Solution 11: BPEI_2 aqueous solution (1.8% by mass) + 135BTC [0.67] + AA {0.14} + EtOH (33% by mass) | 4.7 | 1.00E−07 | 4.70E−06 | 43.5 |
| Example 30 | Solution 12: 3APDES (3% by mass) + 135BTC [1.0] + NH3 <1.5> + EtOH (30% by mass) | 4 | 1.75E−07 | 1.41E−06 | 48.7 |
| Example 31 | Solution 1: 3APDES (2% by mass) + 1Prhe124BTC [1.0] + FA {1.83} + 1PrOH (91% by mass) | 3.4 | 6.60E−09 | 1.30E−08 | 92.7 |
| Example 32 | Solution 2: 3APDES (0.2% by mass) + 1Prhe124BTC [1.0] + FA {1.83} + 1PrOH (99.1% by mass) | 4.4 | 5.60E−09 | 1.10E−08 | 7.7 |
| Example 33 | Solution 3: 3APDES (1.8% by mass) + eheOPDA [1.0] + 1PrOH (33% by mass)30 EtOH (29% by mass) | 3.0 | 6.70E−10 | 3.70E−09 | 114.1 |

As shown in Table 6, in Examples 30 to 33, the relative dielectric constant was smaller than that of Comparative Example 4.

In Example 30, the leakage current density at the electric field strength of 1 MV/cm was equal to that of the Comparative Example 4, and in Examples 31 to 33, the leakage current density at the electric field strength of 1 MV/cm was smaller than that of Comparative Example 4. The leakage current density at the electric field intensity of 2 MV/cm with the increased electric field strength was lower in Examples 30 to 33 than that of Comparative Example 4. Therefore, it was found that a film excellent in electric properties can be obtained by using the composition according to Examples 30 to 33 (in particular, Examples 31 to 33).

<Evaluation of Adhesiveness with Silicon (Si) Substrate>

Example 34

3-aminopropyltriethoxysilane (3APTES) as the compound (A) was dissolved in water to prepare a 50% by mass aqueous solution, and then allowed to stand overnight to prepare a composition. The weight average molecular weight (Mw) after hydrolysis was 430.

Ammonia as the base (C-2) and water were mixed with PMA as the crosslinking agent (B) to prepare a mixed solution of PMA (14% by mass) and ammonia. Ammonia was added in such a manner that the ratio (N/COOH) of the number of nitrogen atoms in the base (C-2) to the number of carboxy groups in the crosslinking agent (B) was 1.5.

A composition (solution 13) was prepared by mixing a mixed solution of PMA and ammonia and water in a 3APTES aqueous solution to have the concentration shown in Table 7.

Example 35

3-aminopropyltriethoxysilane (3APTES) as the compound (A) was dissolved in water to prepare a 50% by mass aqueous solution, and then allowed to stand overnight to prepare a composition. The weight average molecular weight (Mw) after hydrolysis was 430.

Ammonia as the base (C-2) and water were mixed with 124BTC as the crosslinking agent (B) to prepare a mixed solution of 124BTC (14% by mass) and ammonia. Ammonia was added in such a manner that the ratio (N/COOH) of the number of nitrogen atoms in the base (C-2) to the number of carboxy groups in the crosslinking agent (B) was 1.5.

A composition (solution 14) was prepared by mixing a mixed solution of 124BTC and ammonia and water in a 3APTES aqueous solution to have the concentration shown in Table 7.

Example 36

3-aminopropyltriethoxysilane (3APTES) as the compound (A) was dissolved in water to prepare a 50% by mass aqueous solution, and then allowed to stand overnight to prepare a composition. The weight average molecular weight (Mw) after hydrolysis was 430.

Ammonia as the base (C-2) and water were mixed with 135BTC as the crosslinking agent (B) to prepare a mixed solution of 135BTC (14% by mass) and ammonia. Ammonia was added in such a manner that the ratio (N/COOH) of the number of nitrogen atoms in the base (C-2) to the number of carboxy groups in the crosslinking agent (B) was 1.5.

A composition (solution 15) was prepared by mixing a mixed solution of 135BTC and ammonia and water in a 3APTES aqueous solution to have the concentration shown in Table 7.

Example 37

2.0 g of 3APDES was added to 28 g of 1-propanol, 10 g of formic acid (FA) aqueous solution (8.8% by mass) was added dropwise thereto, and the mixture was stirred for one hour at room temperature, and then heated in a 60° C. water bath for one hour to prepare a solution of 3-aminopropyldiethoxymethylsilane (3APDES) as the compound (A).

To the 3APDES solution, a 1-propanol solution of 1-propanol half ester pyromellitic acid (1PrhePMA; 1-propanol half ester PMA) as the crosslinking agent (B), 1-propanol, and water were mixed in such a manner to have the composition shown in Table 7 to prepare a composition (Solution 16).

(Preparation of Samples)

A silicon wafer having silica on its surface is prepared, the silicon wafer was placed on a spin coater, 1.0 mL of the composition (solutions 13 to 16) was added dropwise at a constant rate for 10 seconds, held for 13 seconds, the silicon wafer was then rotated at 2,000 rpm for 1 second, Further, this silicon wafer was rotated at 600 rpm for 30 seconds, then rotated at 2,000 rpm for 10 seconds and dried.

As described above, a polymer layer was formed on a silicon wafer, and a layered body (hereinafter also referred to as "sample (polymer/Si)") having a structure in which a silicon wafer and a polymer layer were layered was obtained.

The sample (Si/polymer) was placed on a hot plate in such a manner that the silicon wafer surface and the hot plate were in contact with each other, and subjected to soft baking (heat treatment) at a soft bake temperature of 100° C. for 60 seconds in the air atmosphere. Further heating was carried out successively in a nitrogen atmosphere at 300° C. for 10 minutes and at 400° C. for 10 minutes.

(Adhesiveness Evaluation)

On the copper film side surface of the layered body, 5×5 square cells of 0.2 cm square were formed with a cutter, Scotch tape (No. 56 manufactured by 3M Company) was pasted, after that, the tape was peeled off at a stretch, and the number of peeled cells was counted.

The results are shown in Table 7.

In Table 7, the concentration in parentheses in each of 3APTES (10% by mass), and 3APDES (2.7% by mass) represents the concentrations of 3APTES and 3APDES in the composition.

The numerical value in parentheses of each of PMA [2.0], 124BTC [1.5], 135BTC [1.0], and 1PrhePMA [0.7] represent the ratio (COOH/N) of the number of carboxy groups in PMA, 124BTC, 135BTC, and 1PrhePMA to the total number of nitrogen atoms in the compound (A).

The numerical value in parentheses of NH3 <1.5> represents the ratio (N/COOH) of the number of nitrogen atoms in NH3 to the number of carboxy groups in the crosslinking agent (B).

The concentration in parentheses in 1PrOH (88% by mass) represents the concentration of 1PrOH in the composition.

<Evaluation of Adhesiveness with Copper (Cu) Substrate>

(Preparation of Samples)

A copper film of 100 nm in thickness was formed on a silicon substrate by plating, and a substrate obtained by cleaning the copper film surface with helium plasma treatment was prepared. A seal layer (polymer layer) was formed on the copper film surface after plasma treatment in the same manner as in <Evaluation of Adhesiveness with Silicon (Si) Substrate>.

A polymer layer was formed on copper as described above to obtain a layered body having a structure in which copper and a polymer layer were layered (hereinafter, also referred to as "sample (polymer/Cu)").

(Adhesiveness Evaluation)

On the copper film side surface of the layered body, 5×5 square cells of 0.2 cm square were formed with a cutter, SCOTCH TAPE (No. 56 manufactured by 3M Company) was pasted, after that, the tape was peeled off at a stretch, and the number of peeled cells was counted.

The results are shown in Table 7.

TABLE 7

| | | Adhesiveness: Polymer/Si grid test | Adhesiveness: Polymer/Cu grid test |
|---|---|---|---|
| Example 34 | Solution 13: 3APTES aqueous solution (10% by mass) + PMA [2.0] + NH3 <1.5> | No peeling | No peeling |
| Example 35 | Solution 14: 3APTES aqueous solution (10% by mass) + 124BTC [1.5] + NH3 <1.5> | No peeling | No peeling |
| Example 36 | Solution 15: 3APTES aqueous solution (10% by mass) + 135BTC [1.0] + NH3 <1.5> | No peeling | No peeling |
| Example 37 | Solution 16: 3APDES aqueous solution (2.7% by mass) + FA {1.83} + 1PrhePMA [0.7] + 1PrOH (88% by mass) | No peeling | No peeling |

As shown in Table 7, when a film was formed using the composition according to Examples 34 to 37, there was no peeling between the polymer and the silicon substrate or the copper substrate, and the adhesiveness was favorable.

<Degradation Temperature Evaluation>

Comparative Example 5

Ammonia as the base (C-2) and water were mixed with PMA as the crosslinking agent (B) to prepare a mixed solution of PMA (14% by mass) and ammonia. Ammonia was added in such a manner that the ratio (N/COOH) of the number of nitrogen atoms in the base (C-2) to the number of carboxy groups in the crosslinking agent (B) reached 1.5.

Comparative Example 6

Ammonia as the base (C-2) and water were mixed with 124BTC as the crosslinking agent (B) to prepare a mixed solution of 124BTC (14% by mass) and ammonia. Ammonia was added in such a manner that the ratio (N/COOH) of the number of nitrogen atoms in the base (C-2) to the number of carboxy groups in the crosslinking agent (B) reached 1.5.

Comparative Example 7

Ammonia as the base (C-2) and water were mixed with 135BTC as the crosslinking agent (B) to prepare a mixed solution of 135BTC (14% by mass) and ammonia. Ammonia was added in such a manner that the ratio (N/COOH) of the number of nitrogen atoms in the base (C-2) to the number of carboxy groups in the crosslinking agent (B) reached 1.5.

Comparative Example 8

A BPEI_2 aqueous solution (1.5% by mass) was prepared.

Comparative Example 9

Ammonia as the base (C-2) and water were mixed with PMA as the crosslinking agent (B) to prepare a mixed solution of PMA (14% by mass) and ammonia.

A BPEI_2 aqueous solution, a mixed solution of PMA and ammonia, and water were mixed in such a manner to have the concentrations shown in Table 8 to prepare a composition (Solution 17).

Comparative Example 10

Ammonia as the base (C-2) and water were mixed with 124BTC as the crosslinking agent (B) to prepare a mixed solution of 124BTC and ammonia.

A BPEI_2 aqueous solution, a mixed solution of 124BTC and ammonia, and water were mixed in such a manner to have the concentrations shown in Table 8 to prepare a composition (Solution 18).

Comparative Example 11

Ammonia as the base (C-2) and water were mixed with 135BTC as the crosslinking agent (B) to prepare a mixed solution of 135BTC and ammonia.

A BPEI_2 aqueous solution, a mixed solution of 135BTC and ammonia, and water were mixed in such a manner to have the concentrations shown in Table 8 to prepare a composition (Solution 19).

Comparative Example 12

3-aminopropyltriethoxysilane (3APTES) as the compound (A) was dissolved in water to prepare a 50% by mass aqueous solution, and then allowed to stand overnight to prepare a composition. The weight average molecular weight (Mw) after hydrolysis was 430. Next, a 3APTES aqueous solution prepared by adding water to 10% by mass was prepared.

Example 38 to 40

The compositions (Solutions 13 to 15) prepared in Examples 34 to 36 were prepared.

Comparative Example 13

3-aminopropyldiethoxymethylsilane (3APDES) as the compound (A) was dissolved in water to prepare a 50% by mass aqueous solution, and then allowed to stand overnight. The weight average molecular weight (Mw) after hydrolysis was 230.

Example 41

The composition (Solution 3) prepared in Examples 20 was prepared.

Comparative Example 14

2.0 g of 3APDES was added to 28 g of 1-propanol, 10 g of formic acid (FA) aqueous solution (8.8% by mass) was added dropwise thereto, and the mixture was stirred for one hour at room temperature, and heated in a 60° C. water bath for one hour, and then 10 g of 1-propanol was added thereto to prepare a solution of 3-aminopropyldiethoxymethylsilane (3APDES) as the compound (A).

Example 42

2.0 g of 3APDES was added to 28 g of 1-propanol, 10 g of formic acid (FA) aqueous solution (8.8% by mass) was added dropwise thereto, and the mixture was stirred for one hour at room temperature, and then heated in a 60° C. water bath for one hour to prepare a solution of 3-aminopropyldiethoxymethylsilane (3APDES) as the compound (A).

To the 3APDES solution, a 1-propanol solution of 1Prhe124BTC as the crosslinking agent (B), 1-propanol, and water were mixed in such a manner to have the composition shown in Table 8 to prepare a composition (Solution 20).

represents the ratio (COOH/N) of the number of carboxy groups in PMA, 124BTC, 135BTC, eheOPDA, or 1Prhe124BTC to the total number of nitrogen atoms in the compound (A).

The numerical value in parentheses of NH3 <1.5> represents the ratio (N/COOH) of the number of nitrogen atoms in NH3 to the number of carboxy groups in the crosslinking agent (B).

The numerical value 1.83 in the parentheses of FA represents the ratio (COOH/N) of the number of carboxy groups in FA to the total number of nitrogen atoms in the compound (A).

The concentration in parentheses in 1PrOH (33% by mass), 1PrOH (76% by mass), 1PrOH (88% by mass), or EtOH (29% by mass) represents the concentration of 1PrOH or EtOH in the composition.

TABLE 8

|  |  | 10% reduction in mass temperature (° C.) |
|---|---|---|
| Comparative Example 5 | PMA (14% by mass) + NH3 <1.5> aqueous solution | 319 |
| Comparative Example 6 | 124BTC (14% by mass) + NH3 <1.5> aqueous solution | 324 |
| Comparative Example 7 | 135BTC (14% by mass) + NH3 <1.5> aqueous solution | 343 |
| Comparative Example 8 | BPEI2 aqueous solution (1.5% by mass) | 351 |
| Comparative Example 9 | Solution 17: BPEI_2 aqueous solution (1.5% by mass) + PMA | 352 |
| Comparative Example 10 | Solution 18: BPEI_2 aqueous solution (1.5% by mass) + 124BTC | 355 |
| Comparative Example 11 | Solution 19: BPEI_2 aqueous solution (1.5% by mass) + 135BTC | 349 |
| Comparative Example 12 | 3APTES (10% by mass) aqueous solution | 384 |
| Example 38 | Solution 13: 3APTES (10% by mass) + PMA [2.0] + NH3 <1.5> | 511 |
| Example 39 | Solution 14: 3APTES (10% by mass) + 124BTC [1.5] + NH3 <1.5> | 479 |
| Example 40 | Solution 15: 3APTES (10% by mass) + 135BTC [1.0] + NH3 <1.5> | 442 |
| Comparative Example 13 | 3APDES (50% by mass) aqueous solution | 366 |
| Example 41 | Solution 3: 3APDES (1.8% by mass) + eheOPDA [1.0] + 1PrOH (33% by mass) + EtOH (29% by mass) | 438 |
| Comparative Example 14 | 3APDES (4% by mass) + FA {1.83} + 1PrOH (76% by mass) | 349 |
| Example 42 | Solution 20: 3APDES (4% by mass) + FA {1.83} + 1Prhe124BTC [1.5] + 1PrOH (88% by mass) | 459 |

(Evaluation Method)

The degradation temperature of the polymer was evaluated by the following method.

100 mg of each of the samples prepared in Examples 38 to 42 and Comparative Examples 5 to 14 was placed in a sample cup and heated at 30° C./min from 30° C. to 550° C. in a nitrogen atmosphere using a thermogravimetric analyzer (DTG-60 (model number) manufactured by Shimadzu Corporation), and the mass was measured at each temperature. Table 8 shows the temperature when 10% reduction from the mass at 300° C.

In Table 8, the concentration in parentheses in each of BPEI_2 aqueous solution (1.5% by mass), 3APTES (10% by mass), 3APDES (50% by mass), 3APDES (1.8% by mass), and 3APDES (4% by mass) represents the concentration of BPEI_2, 3APTES, or 3APDES in the composition.

The concentration in parentheses in each of PMA (14% by mass), 124BTC (14% by mass), and 135BTC (14% by mass) represents the concentration of PMA, 124BTC, or 135BTC in the composition.

The numerical value in parentheses in each of PMA [1.8], 124BTC [1.35], 135BTC [0.9], PMA[2.0], 124BTC [1.5], 135BTC [1.0], eheOPDA [1.0], and 1Prhe124BTC [1.15]

When raising the temperature to 300° C., each sample was solid, and by further raising the temperature, when the solidified polymer degraded, the weight was decreased. The degradation temperature was evaluated at a temperature of 10% reduction from the mass at 300° C.

As shown in Table 8, solids obtained from the compositions of Examples 38 to 42 containing the compound (A) having a Si—O bond and the crosslinking agent (B) had higher degradation temperatures than those of solids obtained from the compositions of Comparative Examples 12 to 14 containing no crosslinking agent (B) and solids obtained from the compositions of Comparative Examples 9 to 11 containing an aliphatic amine having no Si—O bonds and the crosslinking agent (B).

From these results, it was found that a polymer film having a high degradation temperature can be formed by using the compositions of Examples 38 to 42 containing the compound (A) and the crosslinking agent (B).

<Solution Storage Stability Evaluation>

Comparative Example 15

1.14 g of pyromellitic dianhydride (PMDA) was added to a plastic container in a water bath cooled to 5° C. or lower with ice water, 24 g of ethanol was added thereto, and 2.18 g of 3-aminopropyldiethoxymethylsilane (3APDES) was slowly added dropwise thereto, followed by stirring for 2 hours. After confirming that all the compounds were dissolved, 3 g of water was added to obtain a composition for evaluating storage stability (Solution 21). It is presumed that an amic acid of PMDA and 3APDES was formed in Solution 21.

Examples 43 to 45

The compositions (Solutions 13 to 15) prepared in Examples 34 to 36 were prepared.
(Evaluation Method)
The storage stability of the solution was evaluated by the following method.
20 mL to 50 mL of the Solutions 13 to 15, and 21 were placed in a 100 mL polyethylene closed container, and the container was held for 20 days in a refrigerator kept at 5° C. without opening the refrigerator door. After 20 days, the container was taken out of the refrigerator and returned to room temperature. Thereafter, formation of precipitates in the solution, turbidity, and the like were visually observed. A case in which neither formation of precipitate nor turbidity was observed was taken as A, and a case in which at least one of formation of precipitate or turbidity was observed was taken as B.
The evaluation results are shown in Table 9.

TABLE 9

|  |  | 5° C. refrigerated storage 20 days after |
|---|---|---|
| Comparative Example 15 | Solution 21: 3APDES-PMDA amic acid (11% by mass) + EtOH (79% by mass) | B (Gel-like precipitate formed) |
| Example 43 | Solution 13: 3APTES (10% by mass) + PMA [2.0] + NH3<1.5> | A |
| Example 44 | Solution 14: 3APTES (10% by mass) + 124BTC [1.5] + NH3 <1.5> | A |
| Example 45 | Solution 15: 3APTES (10% by mass) + 135BTC [1.0] + NH3 <1.5> | A |

As shown in Table 9, in Solutions 13 to 15 of Examples 43 to 45, no abnormality such as precipitate formation, turbidity, or the like was confirmed after 20 days of refrigerated storage at 5° C. In Solution 21 of Comparative Example 15, a gel-like precipitate was formed.
In Solutions 13 to 15 of Examples 43 to 45, no abnormality such as precipitation, turbidity, or the like in the solution was confirmed even after further storage at room temperature for 10 weeks.
From this, in Solutions 13 to 15 of Examples 43 to 45, it was considered that the compound (A) and the crosslinking agent (B) were dispersed without aggregation in the solution, and it was found that the storage stability was excellent.
<Etching Selectivity Evaluation>

Comparative Example 16

Ammonia as the base (C-2) and water were mixed with PMA as the crosslinking agent (B) to prepare a mixed solution of PMA and ammonia.
A BPEI_2 aqueous solution, a mixed solution of PMA and ammonia, and water were mixed in such a manner to have the concentration shown in Table 10 to prepare a composition (Solution 22).

Example 46

3-aminopropyldiethoxymethylsilane (3APDES) of the compound (A) was dissolved in water to make a 50% by mass aqueous solution, and then allowed to stand overnight to prepare a composition. The weight average molecular weight (Mw) after hydrolysis was 230.
Ammonia as the base (C-2) and water were mixed with 135BTC as the crosslinking agent (B) to prepare a mixed solution of 135BTC (14% by mass) and ammonia.
Next, a 3APDES aqueous solution, a mixed solution of 135BTC and ammonia, and water were mixed in such a manner to have the concentration shown in Table 10 to prepare a composition (solution 23).

Example 47

2.0 g of 3APDES was added to 28 g of 1-propanol, 10 g of formic acid (FA) aqueous solution (8.8% by mass) was added dropwise thereto, and the mixture was stirred for one hour at room temperature, and then heated in a 60° C. water bath for one hour to prepare a solution of 3-aminopropyldiethoxymethylsilane (3APDES) as the compound (A).
To the 3APDES solution, a 1-propanol solution of 1-propyl half-ester oxydiphthalic acid (1PrheOPDA) as the crosslinking agent (B), 1-propanol, and water were mixed in such a manner to have the composition shown in Table 10 to prepare a composition (solution 24).

Example 48

The composition (solution 10) prepared in Example 29 was prepared.
(Preparation of Samples)
A silicon wafer having silica on its surface is prepared, the silicon wafer was placed on a spin coater, 0.5 mL of the composition was added dropwise at a constant rate for 10 seconds, held for 13 seconds, the silicon wafer was then rotated at 2,000 rpm for 1 second, further, this silicon wafer was rotated at 600 rpm for 30 seconds, then rotated at 2,000 rpm for 10 seconds and dried.
As described above, a polymer layer was formed on a silicon wafer, and a layered body (hereinafter also referred to as "sample (polymer/Si)") having a structure in which a silicon wafer and a polymer layer were layered was obtained.
The sample (Si/polymer) was placed on a hot plate in such a manner that the silicon wafer surface and the hot plate were in contact with each other, and subjected to soft baking (heat treatment) at a soft bake temperature of 100° C. for 60 seconds in the air atmosphere. Further heating was carried out successively in a nitrogen atmosphere at 300° C. for 10 minutes and at 400° C. for 10 minutes.
A silicon wafer on which a polymer film was formed by the above method was placed in a chamber, the inside of the chamber was evacuated to $5 \times 10^{-6}$ Torr ($6.7 \times 10^{-4}$ Pa), oxygen was then flowed into the chamber at 50 sccm (about $8.3 \times 10^{-7}$ m$^3$/s), the pressure in the chamber was adjusted to 0.15 Torr (20 Pa), and then irradiated with 100 W oxygen plasma.
The etching selectivity was evaluated by subtracting the film thicknesses of the polymer film after irradiation with oxygen plasma for 3 minutes and 5 minutes from the film thickness of the polymer film after heating at 400° C. for 10 minutes to calculate the reduction amount (nm) of the film thickness. The results are shown in Table 10.

In Table 10, the concentration in parentheses in each of BPEI_2 aqueous solution (1.5% by mass), 3APDES (10% by mass), 3APDES (2.7% by mass), and BATDS (2% by mass) represents the concentration of BPEI_2, 3APDES, or BATDS in the composition.

A numerical value in parentheses in each of PMA [1.42], 135BTC [1.0], 1PrheOPDA [0.7], and eheOPDA [1.0] represents the ratio (COOH/N) of the number of carboxy groups in PMA, 1351BTC, 1PrheOPDA, or eheOPDA to the total number of nitrogen atoms in the compound (A).

A numerical value in parentheses of FA, 1.5 represents the ratio (COOH/N) of the number of carboxy groups in FA to the total number of nitrogen atoms in compound (A).

The numerical value in parentheses of NH3 <1.5> represents the ratio (N/COOH) of the number of nitrogen atoms in NH3 to the number of carboxy groups in the crosslinking agent (B).

The concentration in parentheses in each of 1PrOH (85% by mass), 1PrOH (37% by mass), and EtOH (59% by mass) represents the concentration of 1PrOH or EtOH in the composition.

TABLE 10

|  |  | Thickness reduction after 3 minutes etching (nm) | Thickness reduction after 5 minutes etching (nm) | Initial film thickness after 400° C. firing (nm) |
|---|---|---|---|---|
| Comparative Example 16 | Solution 22: BPEI_2 aqueous solution (1.5% by mass) + PMA [1.42] + NH3 <1.5> | 25 | 34.9 | 55.3 |
| Example 46 | Solution 23: 3APDES (10% by mass) + 135BTC [1.0] + NH3 <1.5> | 16.6 |  | 364.2 |
| Example 47 | Solution 24: 3APDES (2.7% by mass) + FA {1.5} + 1PrheOPDA [0.7] + 1PrOH (85% by mass) | 8.2 | 9.5 | 129.6 |
| Example 48 | solution 10: BATDS (2% by mass) + eheOPDA [1.0] + 1PrOH (37% by mass) + EtOH (59% by mass) |  | 31.2 | 86.6 |

As shown in Table 10, from the result after etching for 3 minutes, the Si—O-containing film obtained using the composition of each of Examples 46 and 47 containing the compound (A) and the crosslinking agent (B) had a smaller amount of film reduction (or etching rate) than the organic film obtained using the composition of Comparative Example 16 containing an aliphatic amine and the crosslinking agent (B).

Similarly, from the result after etching for 5 minutes, the Si—O-containing film obtained using the compositions of Examples 47 and 48 containing the compound (A) and the crosslinking agent (B) had a smaller amount of film reduction (or etching rate) than the organic film obtained using the composition of Comparative Example 16 containing an aliphatic amine and the crosslinking agent (B).

As described above, it was found that the Si—O-containing film obtained using each of the compositions of Examples 46 to 48 had a lower etching rate by oxygen plasma than the organic film (Comparative Example 16), and in other words was excellent in etching selectivity.

From the result after etching for 5 minutes, a Si—O containing film obtained by using a composition of Example 47 containing 3APDES as the compound (A) and 1PrheOPDA as the crosslinking agent (B) had a smaller amount of film reduction (in other words etching rate) than the Si—O-containing film obtained by using the composition of Example 48 containing BATDS as the compound (A) and eheOPDA as the crosslinking agent (B).

The disclosure of Japanese Patent Application No. 2015-224196 filed on Nov. 16, 2015 is hereby incorporated by reference in its entirety.

All documents, patent applications, and technical standards described in this specification are incorporated herein by reference to the same extent as if each individual document, patent application, and technical specification is specifically and individually indicated to be incorporated by reference.

The invention claimed is:

1. A composition for forming a film for semiconductor devices, comprising:
a compound (A) including a Si—O bond and a cationic functional group containing at least one of a primary nitrogen atom or a secondary nitrogen atom;
a crosslinking agent (B) which includes three or more —C(=O)OX groups (X is a hydrogen atom or an alkyl group having from 1 to 6 carbon atoms) in a molecule, wherein from one to six of the three or more —C(=O) OX groups are —C(=O)OH groups, and wherein in the three or more —C(=O)OX groups, at least one X is an alkyl group having from 1 to 6 carbon atoms, the crosslinking agent (B) having a weight average molecular weight of from 200 to 600; and
a polar solvent (D).

2. A composition for forming a film for semiconductor devices, comprising:
a compound (A) including a Si—O bond and a cationic functional group containing at least one of a primary nitrogen atom or a secondary nitrogen atom, and having a weight average molecular weight of from 130 to 10,000;
a crosslinking agent (B) which includes three or more —C(=O)OX groups (X is a hydrogen atom or an alkyl group having from 1 to 6 carbon atoms) in a molecule, wherein from one to six of the three or more —C(=O) OX groups are —C(=O)OH groups, and wherein in the three or more —C(=O)OX groups, at least one X is an alkyl group having from 1 to 6 carbon atoms, the crosslinking agent (B) having a weight average molecular weight of from 200 to 600; and
a polar solvent (D).

3. The composition for forming a film for semiconductor devices according to claim 1, wherein the crosslinking agent (B) has a ring structure in the molecule.

4. The composition for forming a film for semiconductor devices according to claim 1, further comprising at least one additive (C) selected from the group consisting of an acid (C-1) having a carboxy group and a base (C-2) having a nitrogen atom, wherein the acid (C-1) has a weight average molecular weight of from 46 to 195, and the base (C-2) has a weight average molecular weight of from 17 to 120.

5. The composition for forming a film for semiconductor devices according to claim 1, comprising at least one selected from the group consisting of an aliphatic amine having a weight average molecular weight of from 10,000 to 400,000 and an amine compound having a ring structure in a molecule and having a weight average molecular weight of from 90 to 600.

6. The composition for forming a film for semiconductor devices according to claim 1, which is used for a filling material for a recess formed on a substrate.

7. The composition for forming a film for semiconductor devices according to claim 1, which is used in a multilayer resist method.

8. A method of manufacturing the composition for forming a film for semiconductor devices according to claim 1, the method comprising:
mixing the compound (A) and the crosslinking agent (B).

9. The method according to claim 8, wherein the mixing comprises mixing a mixture of an acid (C-1) having a carboxy group and having a weight average molecular weight of from 46 to 195 and the compound (A), and the crosslinking agent (B).

10. The method according to claim 8, wherein the mixing comprises mixing a mixture of a base (C-2) having a nitrogen atom and having a weight average molecular weight of from 17 to 120 and the crosslinking agent (B), and the compound (A).

11. A method of manufacturing a semiconductor member using the composition for forming a film for semiconductor devices according to claim 1, the method comprising:
applying the composition for forming a film for semiconductor devices to a substrate; and
heating the substrate to which the composition for forming a film for semiconductor devices has been applied, at a temperature of from 250° C. to 425° C.

12. A method of manufacturing a semiconductor processing material using the composition for forming a film for semiconductor devices according to claim 1, the method comprising:
applying the composition for forming a film for semiconductor devices to a substrate; and
heating the substrate to which the composition for forming a film for semiconductor devices has been applied, at a temperature of from 250° C. to 425° C.

13. A semiconductor device comprising:
a substrate; and
a reaction product of a compound (A) including a Si—O bond and a cationic functional group containing at least one of a primary nitrogen atom or a secondary nitrogen atom, and having a weight average molecular weight of from 130 to 10,000, and a crosslinking agent (B) which includes three or more —C(=O)OX groups (X is a hydrogen atom or an alkyl group having from 1 to 6 carbon atoms) in a molecule, wherein from one to six of the three or more —C(=O)OX groups are —C(=O)OH groups, and wherein in the three or more —C(=O)OX groups, at least one X is an alkyl group having from 1 to 6 carbon atoms, the crosslinking agent (B) having a weight average molecular weight of from 200 to 600.

14. The semiconductor device according to claim 13, wherein the reaction product includes at least one of an amide bond or an imide bond.

\* \* \* \* \*